(12) United States Patent
Wu et al.

(10) Patent No.: US 10,937,893 B2
(45) Date of Patent: Mar. 2, 2021

(54) SEMICONDUCTOR DEVICE AND MANUFACTURING METHOD THEREOF

(71) Applicant: UNITED MICROELECTRONICS CORP., Hsin-Chu (TW)

(72) Inventors: Chuan-Chang Wu, Kaohsiung (TW); Zhen Wu, Kaohsiung (TW); Hsuan-Hsu Chen, Tainan (TW); Chun-Lung Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/544,830

(22) Filed: Aug. 19, 2019

(65) Prior Publication Data

US 2021/0013325 A1      Jan. 14, 2021

(30) Foreign Application Priority Data

Jul. 8, 2019   (TW) ................................. 108123908

(51) Int. Cl.
| | |
|---|---|
| *H01L 29/423* | (2006.01) |
| *H01L 29/66* | (2006.01) |
| *H01L 29/06* | (2006.01) |
| *H01L 21/02* | (2006.01) |
| *H01L 21/306* | (2006.01) |
| *H01L 21/764* | (2006.01) |
| *H01L 29/786* | (2006.01) |

(52) U.S. Cl.
CPC .. *H01L 29/66742* (2013.01); *H01L 21/02603* (2013.01); *H01L 21/30604* (2013.01); *H01L 21/764* (2013.01); *H01L 29/0649* (2013.01); *H01L 29/0673* (2013.01); *H01L 29/42392* (2013.01); *H01L 29/66545* (2013.01); *H01L 29/78696* (2013.01)

(58) Field of Classification Search
CPC ........................... H01L 29/423; H01L 27/127
See application file for complete search history.

(56) References Cited

U.S. PATENT DOCUMENTS

| | | | |
|---|---|---|---|
| 8,361,869 B2 | 1/2013 | Zhou | |
| 9,419,141 B2 | 8/2016 | Huang | |
| 2019/0131128 A1* | 5/2019 | Yun | ..................... H01L 29/0673 |

* cited by examiner

*Primary Examiner* — Jae Lee
(74) *Attorney, Agent, or Firm* — Winston Hsu

(57) ABSTRACT

A manufacturing method of a semiconductor device includes the following steps. First patterned structures are formed on a substrate. Each of the first patterned structures includes a first semiconductor pattern and a first bottom protection pattern disposed between the first semiconductor pattern and the substrate. A first protection layer is formed on the first patterned structures and the substrate. A part of the first protection layer is located between the first patterned structures. A first opening is formed in the first protection layer between the first patterned structures. The first opening penetrates the first protection layer and exposes a part of the substrate. A first etching process is performed after forming the first opening. A part of the substrate under the first patterned structures is removed by the first etching process for suspending at least a part of each of the first patterned structures above the substrate.

11 Claims, 19 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including semiconductor patterns and a manufacturing method thereof.

2. Description of the Prior Art

The conventional planar metal-oxide-semiconductor (MOS) transistor has difficulty when scaling down in the development of the semiconductor device. Therefore, the stereoscopic transistor technology or the non-planar transistor technology that allows smaller size and higher performance is developed to replace the planar MOS transistor. For example, dual-gate fin field effect transistor (FinFET) device, tri-gate FinFET device, and omega-FinFET device have been provided. Furthermore, gate-all-around (GAA) nanowire FET device is progressed for achieving the ongoing goals of high performance, increased miniaturization of integrated circuit components, and greater packaging density of integrated circuits. However, under the concept of the GAA, the manufacturing yield and/or the electrical performance of the semiconductor device still has to be further improved by modifying related processes and/or structural design.

SUMMARY OF THE INVENTION

It is one of the objectives of the present invention to provide a semiconductor device and a manufacturing method thereof. A protection layer and a protection pattern are used to form a protection effect for a semiconductor pattern in an etching process performed to a substrate, and negative influence of the etching process on the semiconductor pattern may be avoided accordingly. In addition, semiconductor patterns arranged misaligned with one another in a thickness direction of the substrate may be formed by the manufacturing method of the present invention, and the device integrity may be enhanced and/or the related structural design limitation may be reduced accordingly.

A manufacturing method of a semiconductor device is provided in an embodiment of the present invention. The manufacturing method includes the following steps. First patterned structures are formed on a substrate. Each of the first patterned structures includes a first semiconductor pattern and a first bottom protection pattern, and the first bottom protection pattern is disposed between the first semiconductor pattern and the substrate. A first protection layer is formed on the first patterned structures and the substrate. A part of the first protection layer is located between the first patterned structures. A first opening is formed in the first protection layer between the first patterned structures. The first opening penetrates the first protection layer and exposes a part of the substrate. A first etching process is performed after the step of forming the first opening. A part of the substrate under the first patterned structures is removed by the first etching process for suspending at least a part of each of the first patterned structures above the substrate.

A semiconductor device is provided in an embodiment of the present invention. The semiconductor device includes a substrate, a plurality of first semiconductor patterns, and a plurality of second semiconductor patterns. The substrate includes a recess. The first semiconductor patterns are disposed on the substrate. At least a part of each of the first semiconductor patterns is disposed above the recess. The second semiconductor patterns are disposed above the first semiconductor patterns. The second semiconductor patterns and the first semiconductor patterns are arranged misaligned with one another in a thickness direction of the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

FIGS. 12-16 are schematic drawings illustrating a manufacturing method of a semiconductor device according to a third embodiment of the present invention, wherein FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, and FIG. 16 is a schematic drawing in a step subsequent to FIG. 15.

FIG. 17 and FIG. 18 are schematic drawings illustrating a manufacturing method of a semiconductor device according to a fourth embodiment of the present invention, wherein FIG. 18 is a schematic drawing in a step subsequent to FIG. 17.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
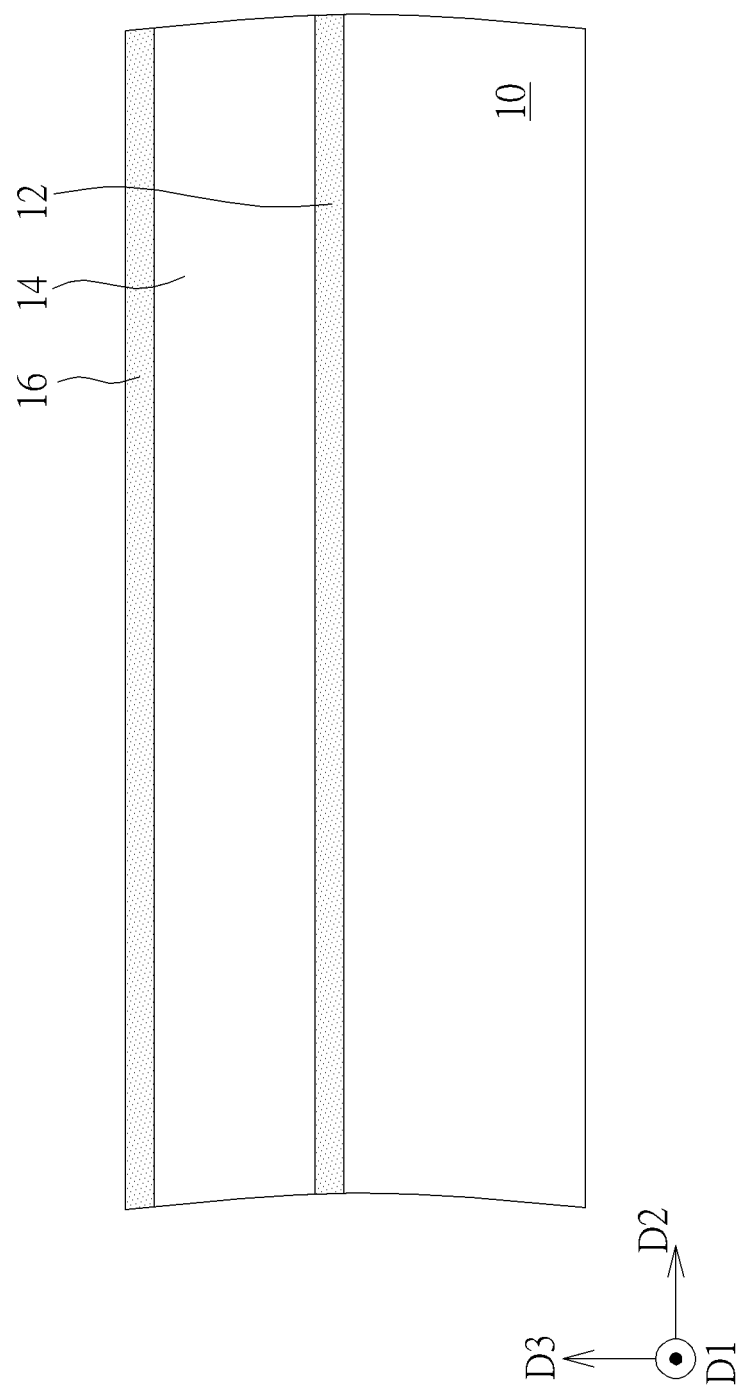
Figure 2:
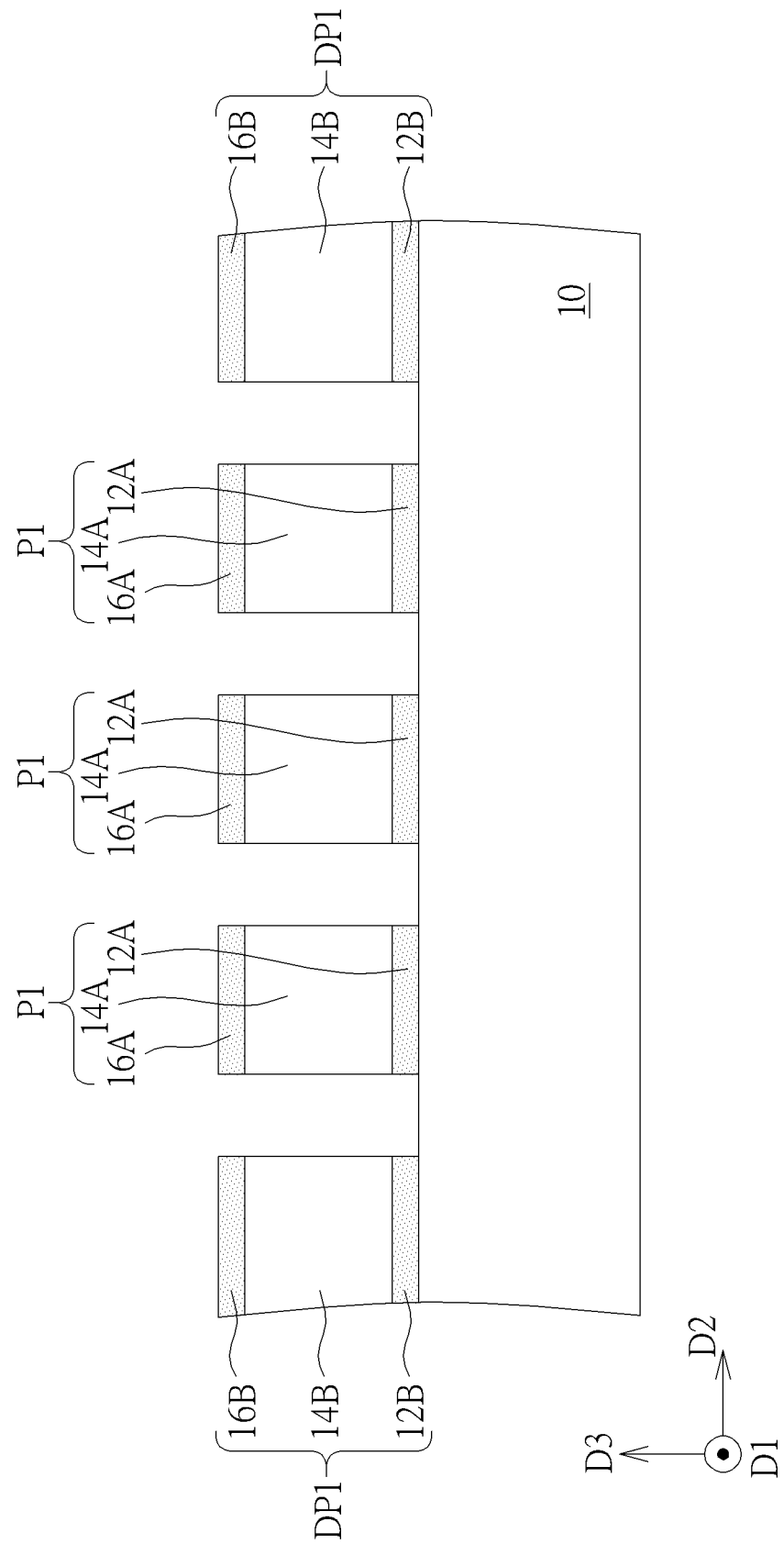
Figure 3:
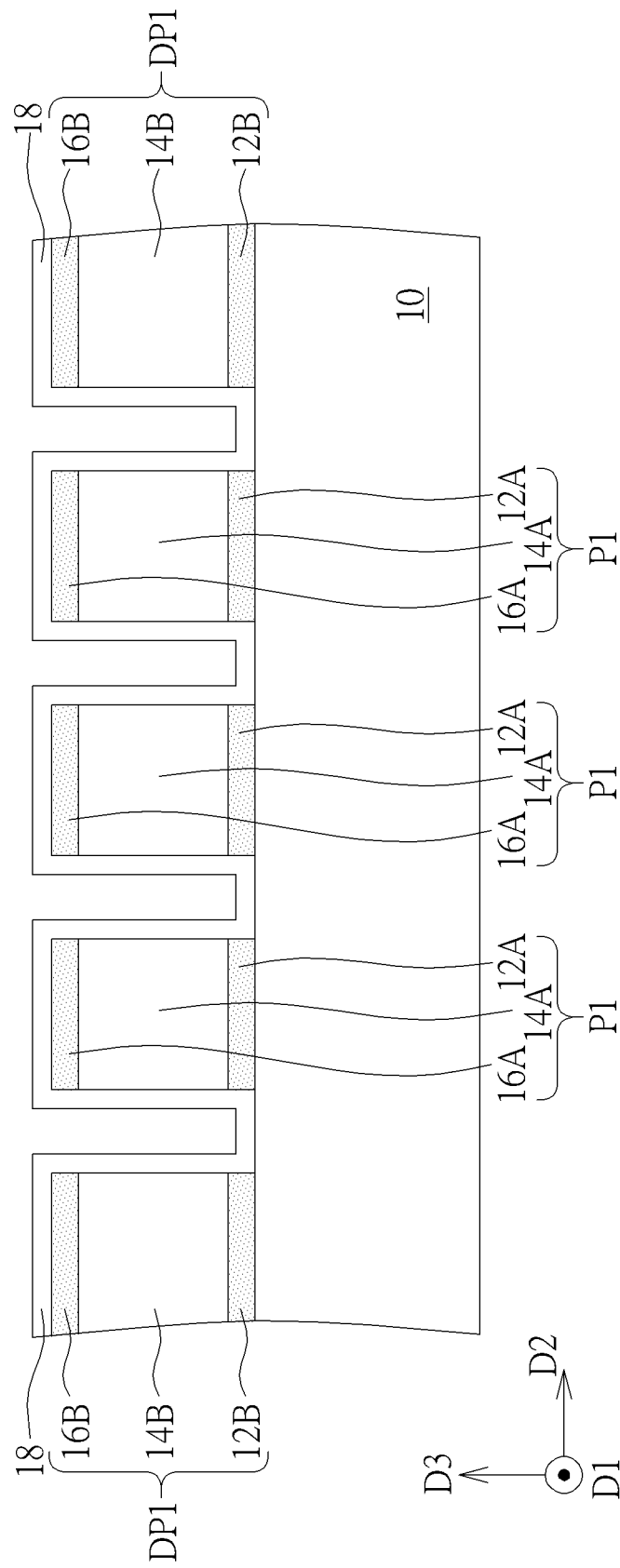
Figure 4:
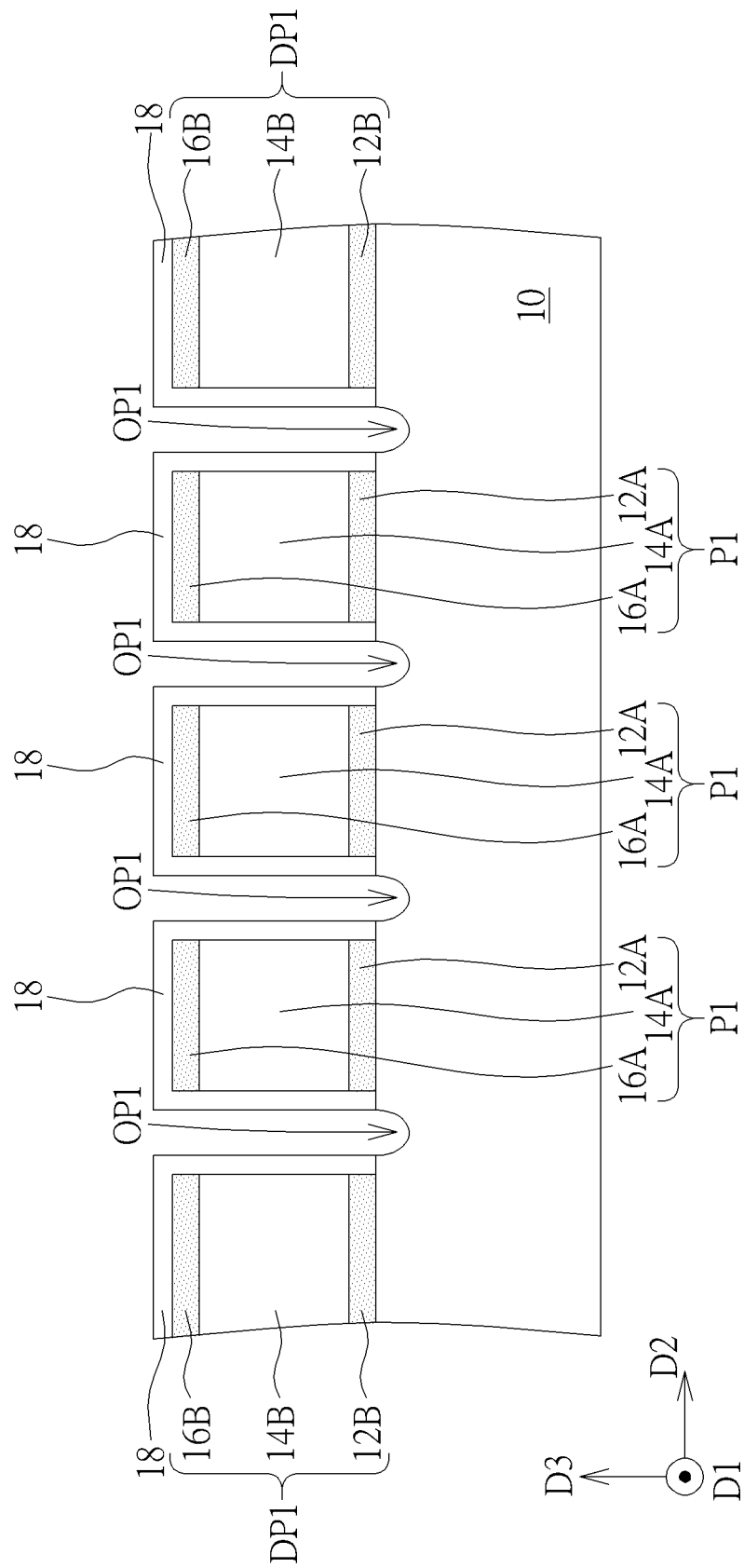
Figure 5:
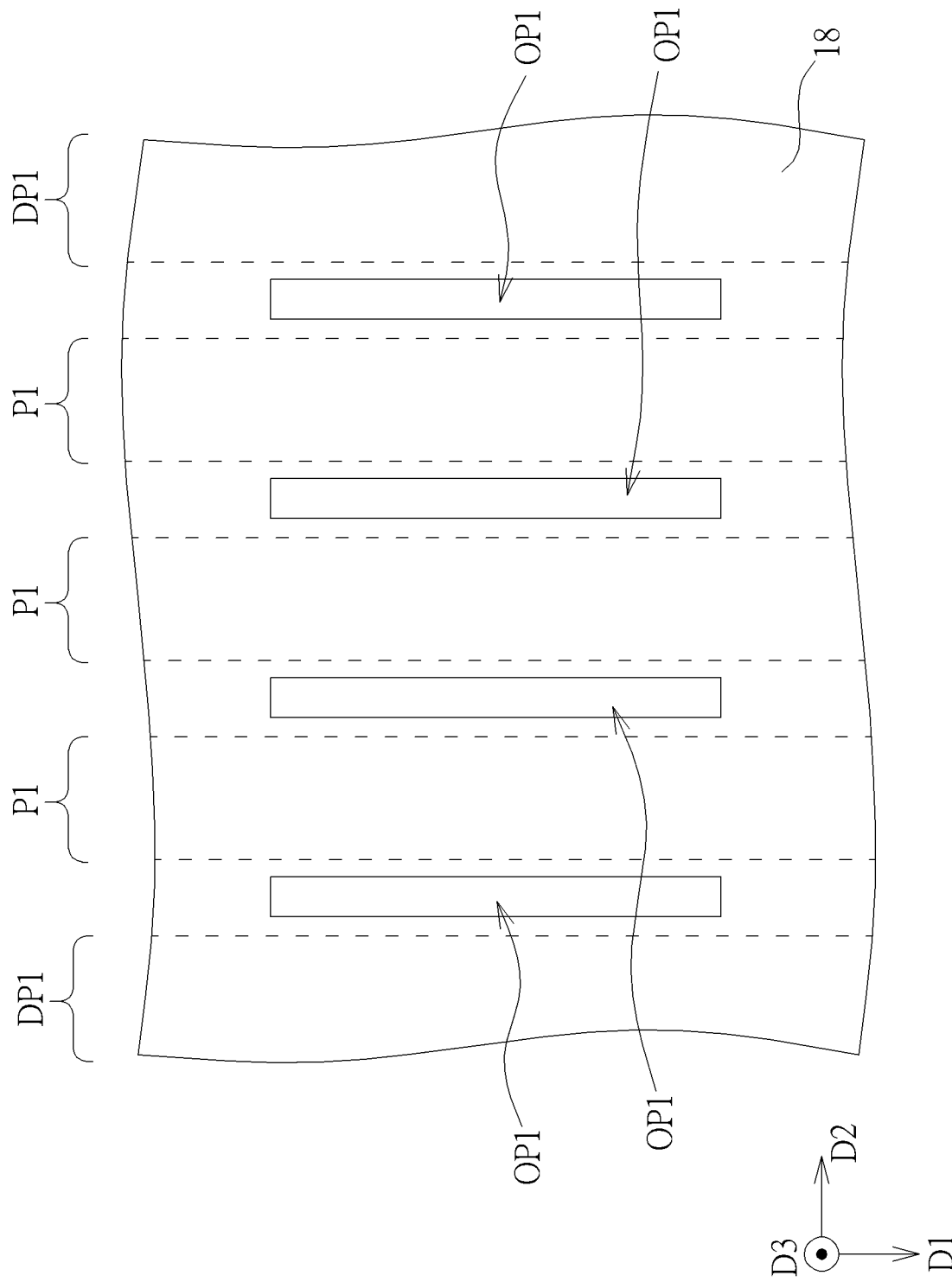
Figure 6:
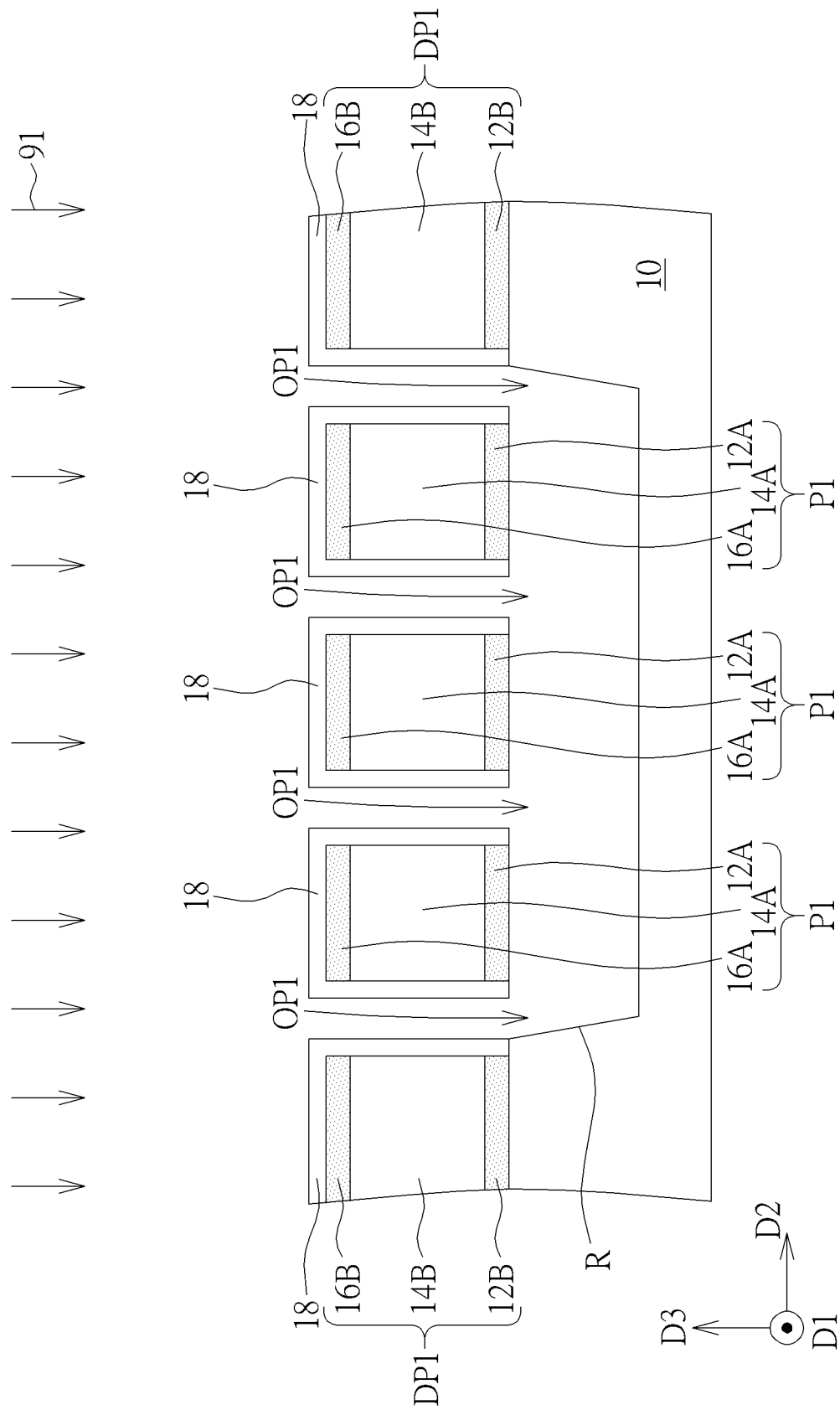
Figure 7:
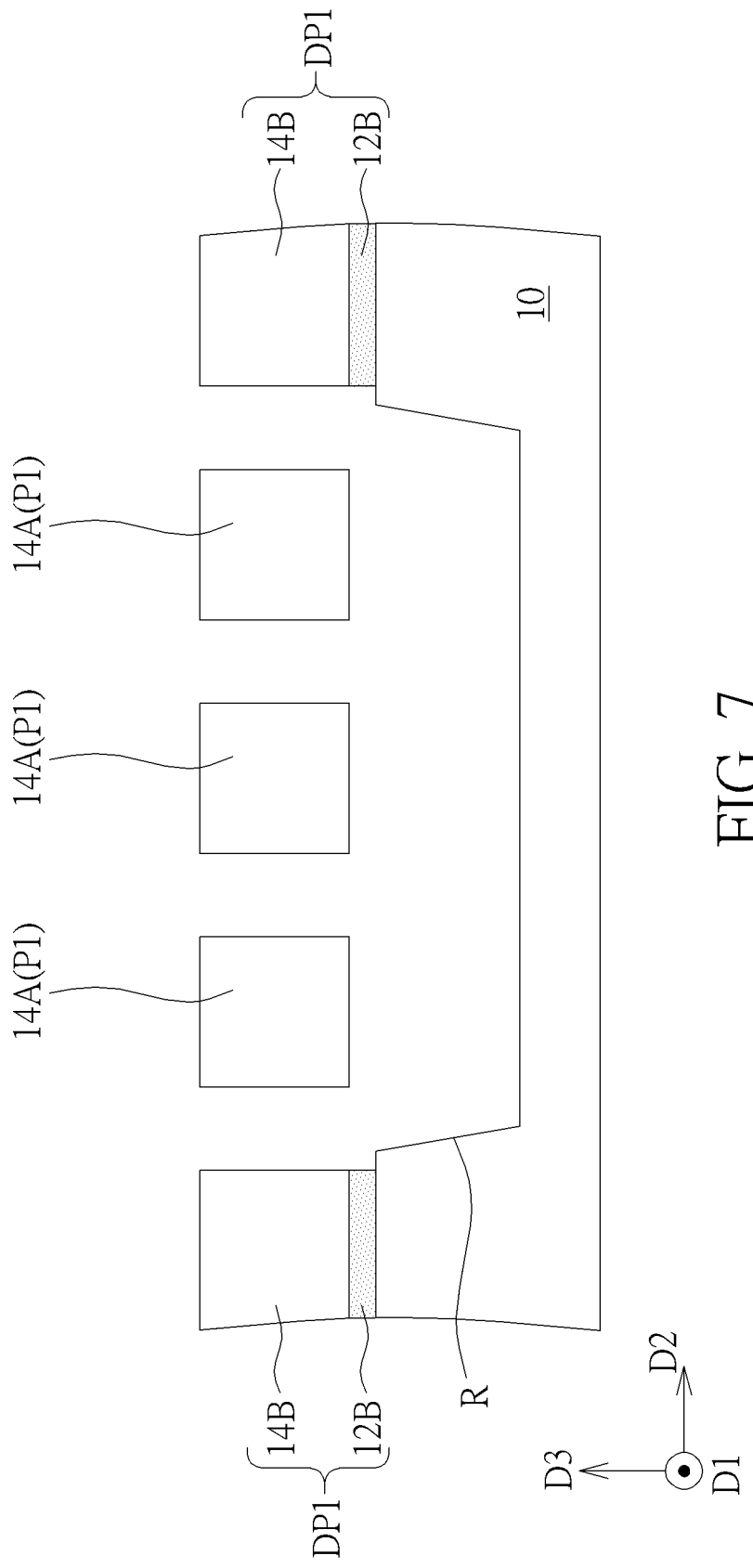
Figure 8:
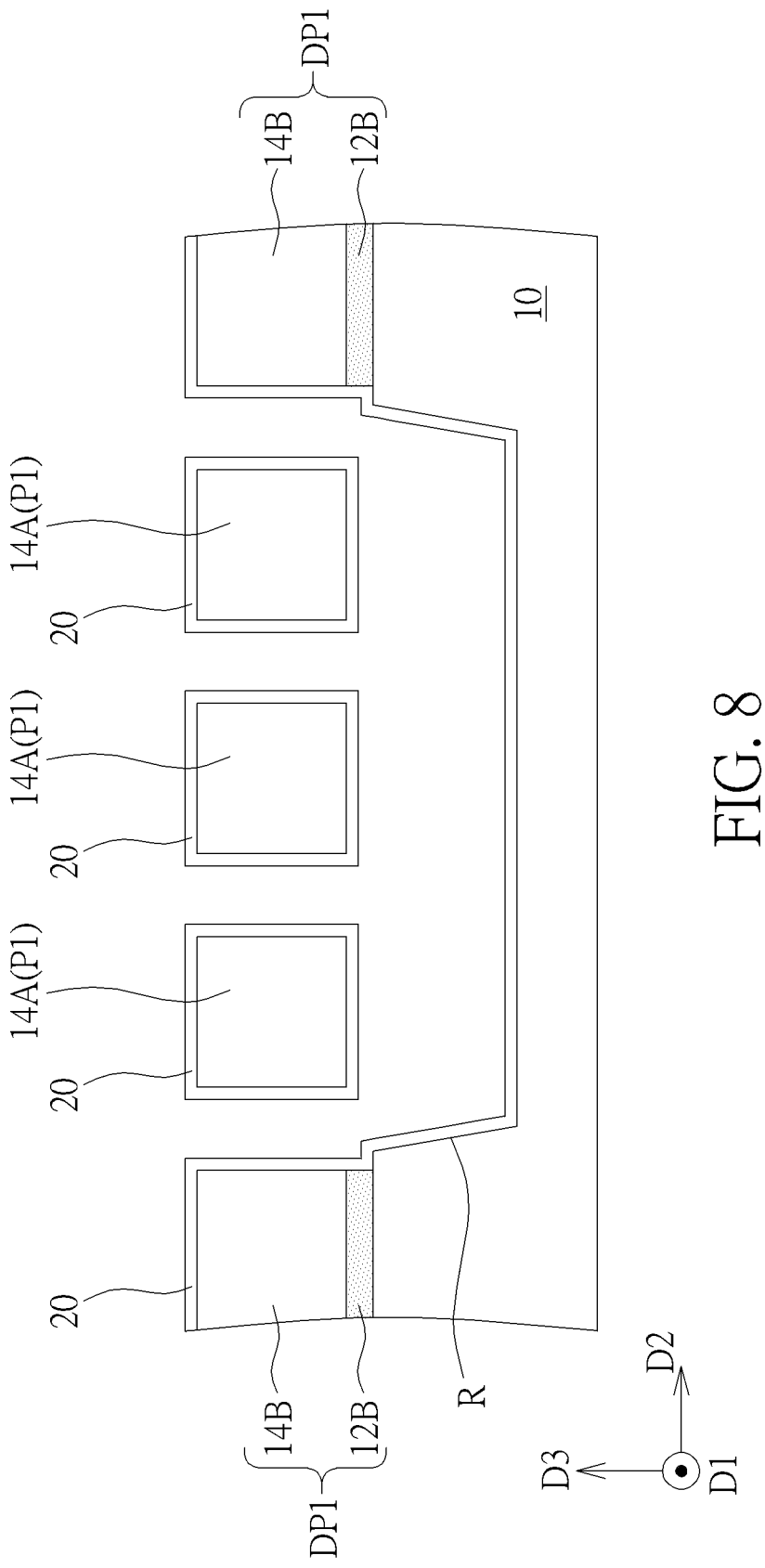
Figure 9:
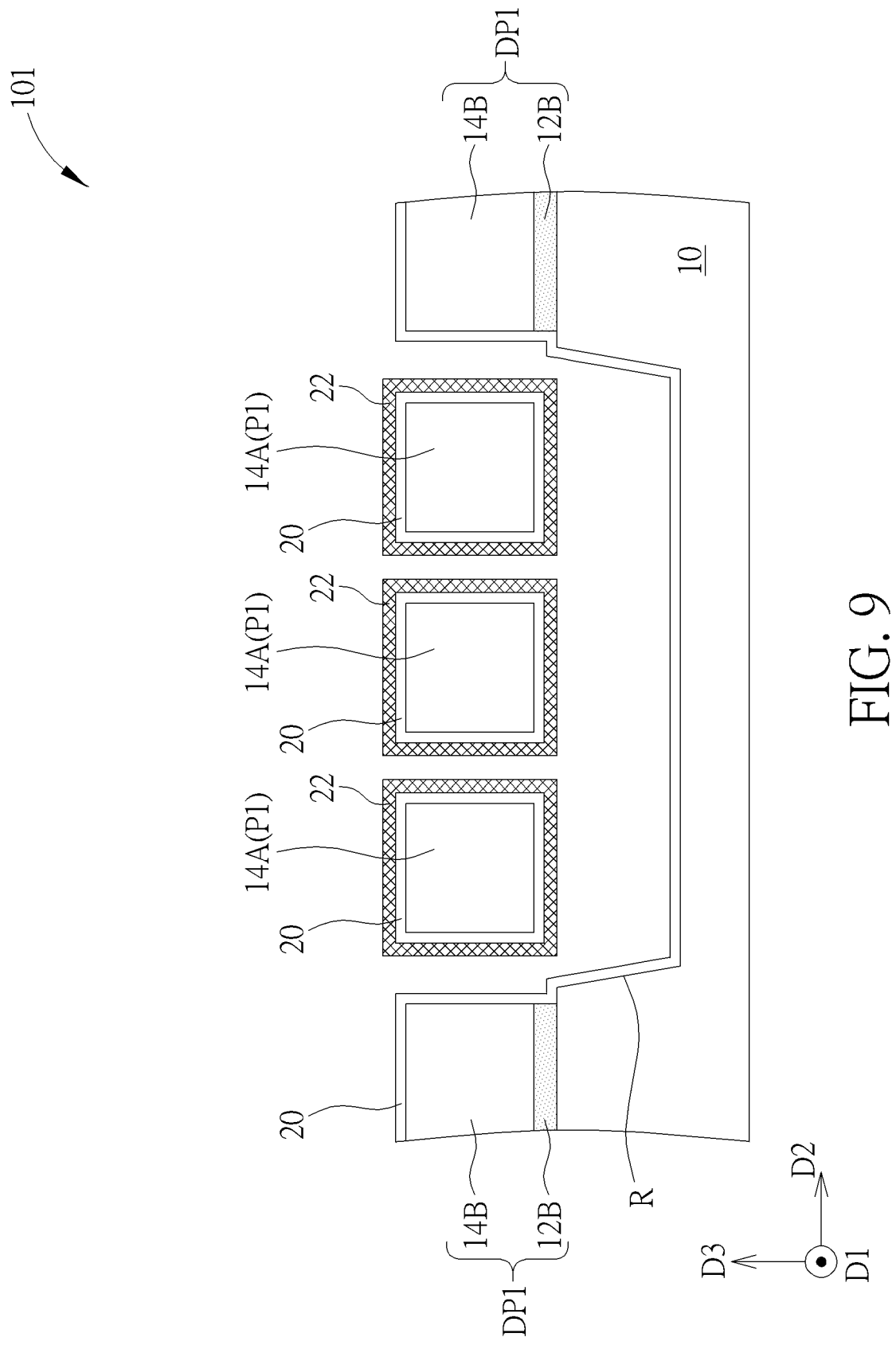

Please refer to FIGS. 1-9. FIGS. 1-9 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8. The manufacturing method in this embodiment may include the following steps. Firstly, as shown in FIG. 1 and FIG. 2, a plurality of first patterned structures P1 are formed on a substrate 10. Each of the first patterned structures P1 may include a first semiconductor pattern 14A and a first bottom protection pattern 12A, and the first bottom protection pattern 12A may be disposed between the first semiconductor pattern 14A and the substrate 10. In some embodiments, the substrate 10 may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. Additionally, the first bottom protection pattern 12A may include an insulation material, such as silicon oxide, silicon nitride, silicon oxynitride, or other suitable protection materials, and the first semiconductor pattern 14A may include silicon, germanium, silicon-germanium (SiGe), or other suitable semiconductor materials.

The forming method of the first patterned structures P1 in this embodiment may include but is not limited to the following steps. Firstly, as shown in FIG. 1, a first bottom protection layer 12, a first semiconductor layer 14, and a first top protection layer 16 may be formed sequentially and stacked on the substrate 10. As shown in FIG. 1 and FIG. 2, a patterning process may be performed to the first bottom protection layer 12, the first semiconductor layer 14, and the first top protection layer 16 for forming the first patterned structures P1. In some embodiments, the first bottom protection layer 12 and the first top protection layer 16 may include an insulation material, such as silicon oxide, silicon nitride, silicon oxynitride, or other suitable protection materials, and the first semiconductor layer 14 may include silicon, germanium, silicon-germanium, or other suitable semiconductor materials. In addition, the first bottom protection layer 12 and the first top protection layer 16 may be formed by thin film deposition processes, chemical treatments, thermal treatments, or other suitable approaches, and the first semiconductor layer 14 may be formed by an epitaxial growth process for improving the film-forming quality of the first semiconductor layer 14 and/or controlling the thickness of the first semiconductor layer 14, but not limited thereto. In some embodiments, the first semiconductor layer 14 may also be formed by other suitable film-forming approaches, such as a vapor deposition process according to some considerations. Additionally, the patterning process described above may include a photolithography process or other suitable patterning approaches, and the first bottom protection layer 12, the first semiconductor layer 14 and the first top protection layer 16 may be etched by one or more etching steps for forming the first patterned structures P1. In the manufacturing method described above, a projection area of the first bottom protection pattern 12A of each of the first patterned structures P1 in a thickness direction of the substrate 10 (such as a third direction D3 shown in FIG. 2) may be substantially equal to a projection area of the first semiconductor pattern 14A of each of the first patterned structures P1 in the thickness direction of the substrate 10, but not limited thereto.

In some embodiments, the first top protection layer 16 may be patterned to be a plurality of first top protection patterns 16A on the first semiconductor patterns 14A respectively by the patterning process described above. In other words, each of the first patterned structures P1 may further include the first top protection pattern 16A disposed on the first semiconductor pattern 14A, but not limited thereto. Additionally, in some embodiments, each of the first patterned structure P1 may be elongated in a first direction D1, the first patterned structures P1 may be disposed parallel to one another, and the first patterned structure P1 may be repeatedly disposed in a second direction D2. The first direction D1 may be substantially orthogonal to the second direction D2, but not limited thereto. Additionally, in the patterning process of forming the first patterned structures P1, some of the first bottom protection layer 12, the first semiconductor layer 14, and the first top protection layer 16 may be patterned to be first dummy patterned structures DP1 disposed at two opposite sides of the first patterned structures P1 in the second direction D2, but not limited thereto. Therefore, the first dummy patterned structure DP1 may include a first dummy bottom protection pattern 12B formed by patterning the first bottom protection layer 12, a first dummy semiconductor pattern 14B formed by patterning the first semiconductor layer 14, and a first dummy top protection pattern 16B formed by patterning the first top protection layer 16.

Subsequently, as shown in FIG. 2 and FIG. 3, a first protection layer 18 is formed on the first patterned structures P1, the first dummy patterned structures DP1 and the substrate 10. A part of the first protection layer 18 may be located between the first patterned structures P1, and another part of the first protection layer 18 may be located between the first patterned structure P1 and the first dummy patterned structure DP1. As shown in FIG. 3 and FIG. 4, a first opening OP1 may then be formed on the first protection layer 18, and the first opening OP1 may penetrate the first protection layer 18 and expose a part of the substrate 10. In some embodiments, a plurality of the first openings OP1 may be formed in the first protection layer 18. Some of the first openings OP1 may be formed in the first protection layer 18 between the first patterned structures P1, and some of the first openings OP1 may be formed in the first protection layer 18 between the first patterned structure P1 and the first dummy patterned structure DP1. In addition, the first openings OP1 may be formed by an etching process, and a patterned mask (not shown) may cover the first protection layer 18 on the first patterned structures P1 and the first dummy patterned structures DP1 in this etching process for avoiding removing the first protection layer 18 on the first patterned structures P1 and the first dummy patterned structures DP1 by the etching process of forming the first openings OP1. In other words, after the step of forming the first openings OP1, a top surface and a side surface of each of the first patterned structures P1 may still be covered by the first protection layer 18, but not limited thereto. In some embodiments, the first protection layer 18 located on the top surface of the first patterned structure P1 may be partially removed after the step of forming the first openings OP1, but a top surface and a bottom surface of the first semiconductor pattern 14A in each of the first patterned structures P1 may still be covered by the first top protection pattern 16A and the first bottom protection pattern 12A respectively, and a side surface of the first semiconductor pattern 14A may still be covered by the first protection layer 18 for providing a protection effect in subsequent etching processes. Additionally, in some embodiments, a part of the substrate 10 may be removed by the etching process of forming the first openings OP1, In some embodiments, the first protection layer 18 may be conformally formed on the first patterned structures P1, the first dummy patterned structures DP1, and the substrate 10. Accordingly, the space between the first patterned structures P1 adjacent to each other and the space between the first patterned structure P1 and the first dummy patterned structure DP1 may not be fully filled with the first protection layer 18 for being beneficial to the formation of the first openings OP1 and reducing the etching time of the etching process for forming the first openings OP1. Additionally, as shown in FIG. 4 and FIG. 5, in some embodiments, each of the first openings OP1 may be elongated in the first direction D1, and a length of each of the first openings OP1 in the first direction D1 may be shorter than a length of each of the first patterned structures P1 in the first direction D1, but not limited thereto.

As shown in FIG. 4 and FIG. 6, a first etching process 91 is performed after the step of forming the first openings OP1, and a part of the substrate 10 under the first patterned structures P1 may be removed by the first etching process 91 for suspending at least a part of each of the first patterned structures P1 above the substrate 10. In some embodiments, the substrate 10 may be etched by the first etching process 91 through the first openings OP1 for forming a recess R in the substrate 10. At least a part of each of the first patterned structures P1 may be located above the recess R in the third direction D3, and at least a part of each of the first patterned structures P1 may be separated from the substrate 10 by the recess R for being suspended above the substrate 10. In some embodiments, each of the first semiconductor patterns 14A may be encompassed by the first bottom protection pattern 12A, the first bottom protection pattern 16A, and the first protection layer 18 in the first etching process 91 for avoiding negative influence of the first etching process 91 on the first semiconductor patterns 14A (such as etching the first semiconductor patterns 14A and/or influencing the material properties of the first semiconductor patterns 14A). Additionally, in some embodiments, each of the first semiconductor patterns 14A may be encompassed by the first bottom protection pattern 12A and the first protection layer 18 in the first etching process 91 for providing the protection effect without forming the first top protection patterns 16A according to some considerations. In other words, each of the first semiconductor patterns 14A is not exposed in the first etching process 91 for avoiding negative influence of the first etching process 91 on the first semiconductor patterns 14A.

In some embodiments, the first etching process 91 may include an isotropic etching process, such as a wet isotropic etching process for enhancing the etching selectivity of the first etching process 91 between the substrate 10 and other material layers (such as the first protection layer 18 and the first bottom protection patterns 12A), but not limited thereto. In some embodiments, the first etching process 91 may include other suitable etching approaches according to some considerations. For example, when the substrate 10 is a silicon substrate, the first etching process 91 may include a wet etching process using ammonia solution ($NH_4OH$) or tetramethylammonium hydroxide (TMAH) for etching the substrate 10 and reducing and/or avoiding etching the first protection layer 18 and the first bottom protection patterns 12A by the first etching process 91, but not limited thereto. In addition, the depth of the recess R may be controlled by modifying the process parameters (such as the etching rate and/or the etching time) of the first etching process 91 for avoiding penetrating the substrate 10 by the recess R.

As shown in FIG. 6 and FIG. 7, after the first etching process 91, at least a part of each of the first bottom protection patterns 12A, at least a part of each of the first top protection patterns 16A, and at least a part of the first protection layer 18 may be removed for exposing at least a part of each of the first semiconductor patterns 14A. In some embodiments, a single etching step may be used for removing the first bottom protection patterns 12A, the first top protection patterns 16A, and the first protection layer 18 together or etching steps may be used for removing the first bottom protection patterns 12A, the first top protection patterns 16A, and the first protection layer 18 respectively. For example, when the material of the first protection layer 18 is silicon nitride and the materials of the first bottom protection patterns 12A and the first top protection patterns 16A are silicon oxide, a wet etching process including a $H_3PO$-based agent may be used for removing the first protection layer 18, and a wet etching process including dilute hydrofluoric acid (dHF) may be used for removing the first bottom protection patterns 12A and the first top protection patterns 16A, but not limited thereto. In some embodiments, other suitable etching approaches may be employed for removing the first bottom protection patterns 12A, the first top protection patterns 16A, and the first protection layer 18 according to the materials of the first bottom protection patterns 12A, the first top protection patterns 16A, and the first protection layer 18. Additionally, in some embodiments, the step of forming the first top protection patterns 16A may be omitted according to some considerations, and at least a part of each of the first bottom protection patterns 12A and at least a part of the first protection layer 18 may be removed after the first etching process 91 for exposing at least a part of each of the first semiconductor patterns 14A. In some embodiments, the first dummy top protection pattern 16B in the first dummy structure DP1 and the first top protection patterns 16A may be removed concurrently, and at least a part of the first dummy bottom protection pattern 12B may still remain between the first dummy semiconductor pattern 14B and the substrate 10 after the step of removing the first bottom protection patterns 12A because the first dummy patterned structures DP1 are not suspended above the substrate 10.

As shown in FIG. 7 and FIG. 8, a gate dielectric layer 20 may be formed on the exposed part of each of the first semiconductor patterns 14A. The gate dielectric layer 20 may include silicon oxide, silicon oxynitride, a high dielectric constant (high-k) material, or other suitable dielectric materials. The high-k material described above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. In some embodiments, the gate dielectric layer 20 may be formed by an atomic layer deposition (ALD) process or other suitable film-forming processes. The gate dielectric layer 20 may encompass each of the first semiconductor patterns 14A, and the gate dielectric layer 20 may be partially formed on the first dummy patterned structures DP1 and in the recess R, but not limited thereto.

As shown in FIG. 8 and FIG. 9, after the step of forming the gate dielectric layer 20, a gate structure 22 may be formed on the gate dielectric layer 20, and a part of each of the first semiconductor patterns 14A may be encompassed by the gate dielectric layer 20 and the gate structure 22. In some embodiments, the gate structure 22 may include a single layer or multiple layers of conductive materials, such as tungsten (W), aluminum (Al), copper (Cu), titanium aluminide (TiAl), titanium (Ti), titanium nitride (TiN), tantalum (Ta), tantalum nitride (TaN), titanium aluminum oxide (TiAlO), or other suitable metallic conductive materials or non-metallic conductive materials. Additionally, the gate structure 22 may be formed by a chemical vapor deposition (CVD) process or other suitable film-forming processes, and the above-mentioned conductive material which is not formed on the first semiconductor patterns 14A may be removed by a patterning approach for forming the gate structure 22. In some embodiments, the gate structure 22 formed on one of the first semiconductor patterns 14A may be separated from the gate structure 22 formed on another one of the first semiconductor patterns 14A, but not limited thereto. For example, as shown in FIG. 9, the first semiconductor patterns 14 separated from one another may be formed above the recess R in the substrate 10, the gate dielectric layers 20 and the gate structures 22 may be formed on these first semiconductor patterns 14 respectively, and the gate structures 22 may be separated from one another. Additionally, each of the gate structures 22 may not contact the substrate 10 and the gate dielectric layer 20 on the substrate 10, and each of the gate structures 22 may be suspended above the substrate 10 and located above the recess R.

Figure 10:
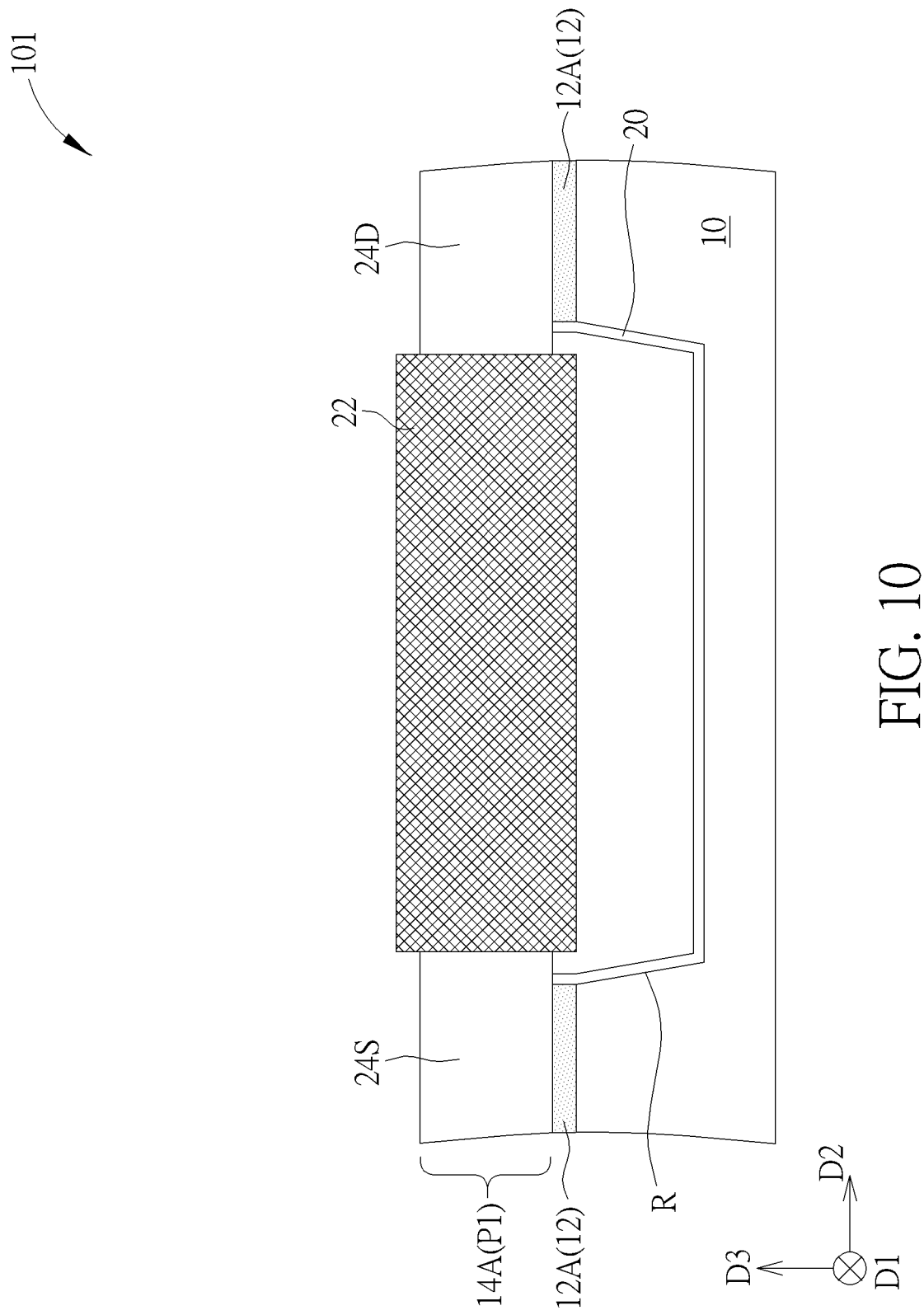
FIG. 10 is a schematic drawing illustrating a semiconductor device according to the first embodiment of the present invention.

Please refer to FIG. 9 and FIG. 10. FIG. 10 is a cross-sectional schematic drawing illustrating the semiconductor device 101 taken along another direction. As shown in FIG. 9 and FIG. 10, in some embodiments, the gate structure 22 may encompass only a part of the first semiconductor pattern 14A, and another part of the first semiconductor pattern 14 which is not encompassed by the gate dielectric layer 20 and the gate structure 22 may become a source region 24S and a drain region 24D by a doping process or other suitable treatments for forming a transistor structure, which may be regarded as a gate-all-around (GAA) transistor structure, but not limited thereto. A part of the source region 24S and a part of the drain region 24D may not overlap the recess R in the third direction D3, and a part of the first bottom protection pattern 12A may remain between the source region 24S and the substrate 10 and between the drain region 24D and the substrate 10, but not limited thereto. As shown in FIG. 9 and FIG. 10, the semiconductor device 101 may include the substrate 10 including the recess R, the plurality of the first semiconductor patterns 14A, the gate dielectric layer 20, and the gate structure 22. The first semiconductor patterns 14A are disposed on the substrate 10. At least a part of each of the first semiconductor patterns 14A may be disposed above the recess R and be suspended above the recess R, and the gate dielectric layer 20 and the gate structure 22 may be formed encompassing the a part of each of the first semiconductor patterns 14A for forming a plurality of GAA transistor structures accordingly. Additionally, in some embodiments, contact structures (not shown) may be formed on the gate structures 22 correspondingly for controlling the electrical conditions of different gate structures 22. In this embodiment, the first protection layer 18 and the first bottom protection pattern 12A located under each of the first semiconductor patterns 14A may be used to provide a protection effect to the first semiconductor patterns 14A during the etching process of etching the substrate 10 and suspending at least a part of each of the first semiconductor patterns 14A above the substrate 10, and the purposes of improving the manufacturing yield and/or enhancing the related electrical performance of the semiconductor device 101 may be achieved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
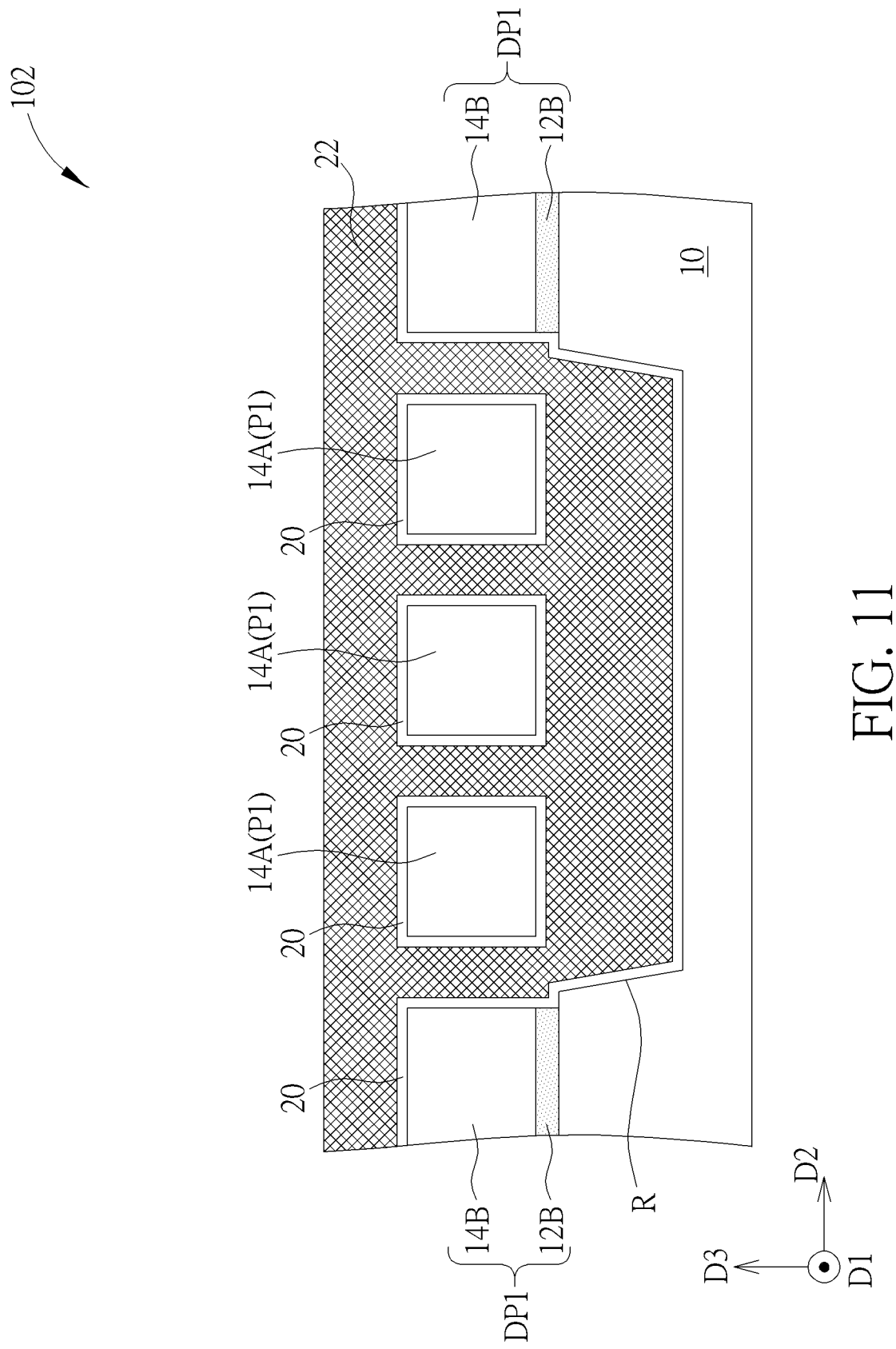
FIG. 11 is a schematic drawing illustrating a semiconductor device according to a second embodiment of the present invention.

Please refer to FIG. 11. FIG. 11 is a schematic drawing illustrating a semiconductor device 102 according to a second embodiment of the present invention. As shown in FIG. 11, the difference between the semiconductor device 102 and the semiconductor device in the first embodiment described above is that, in the semiconductor device 102, the gate structure 22 may encompass the first semiconductor patterns 14 separated from one another concurrently. Therefore, the gate structure 22 formed on one of the first semiconductor patterns 14A may be connected with the gate structure 22 formed on another one of the first semiconductor patterns 14A. In addition, the gate structure 22 may be partially formed on the first dummy patterned structures DP1 and/or partially formed in the recess R, but not limited thereto.

Figure 12:
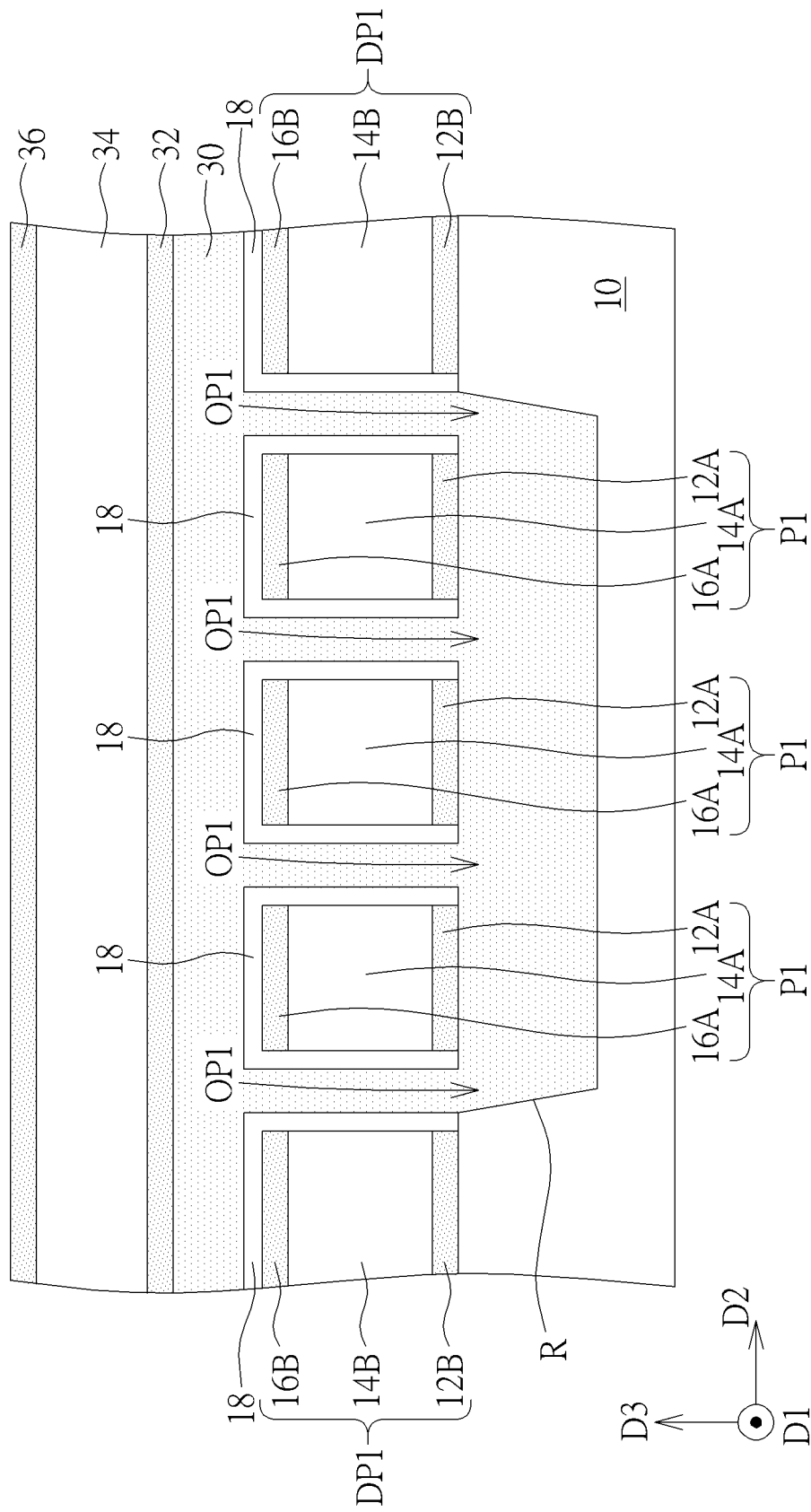
Figure 13:
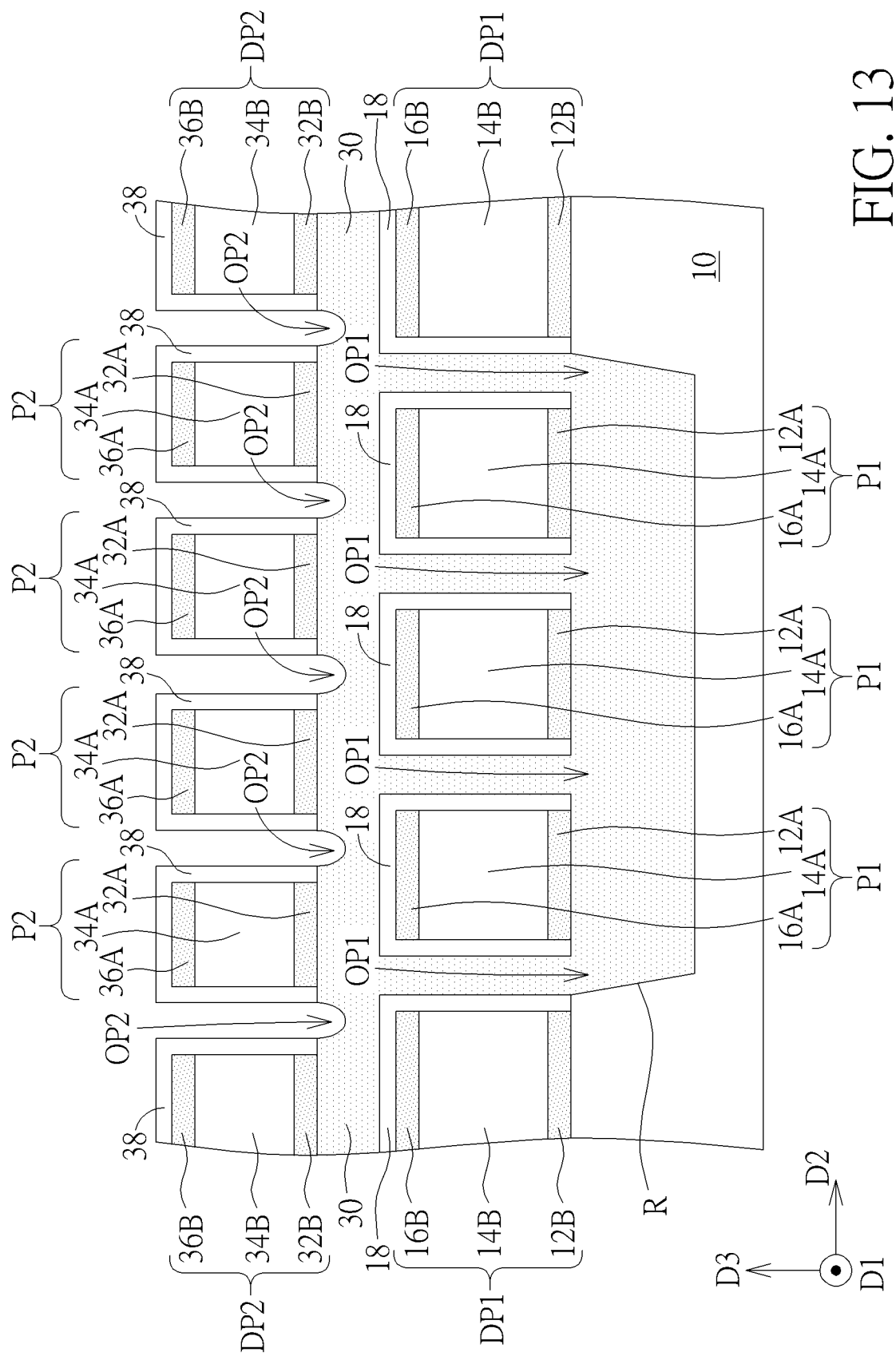
Figure 14:
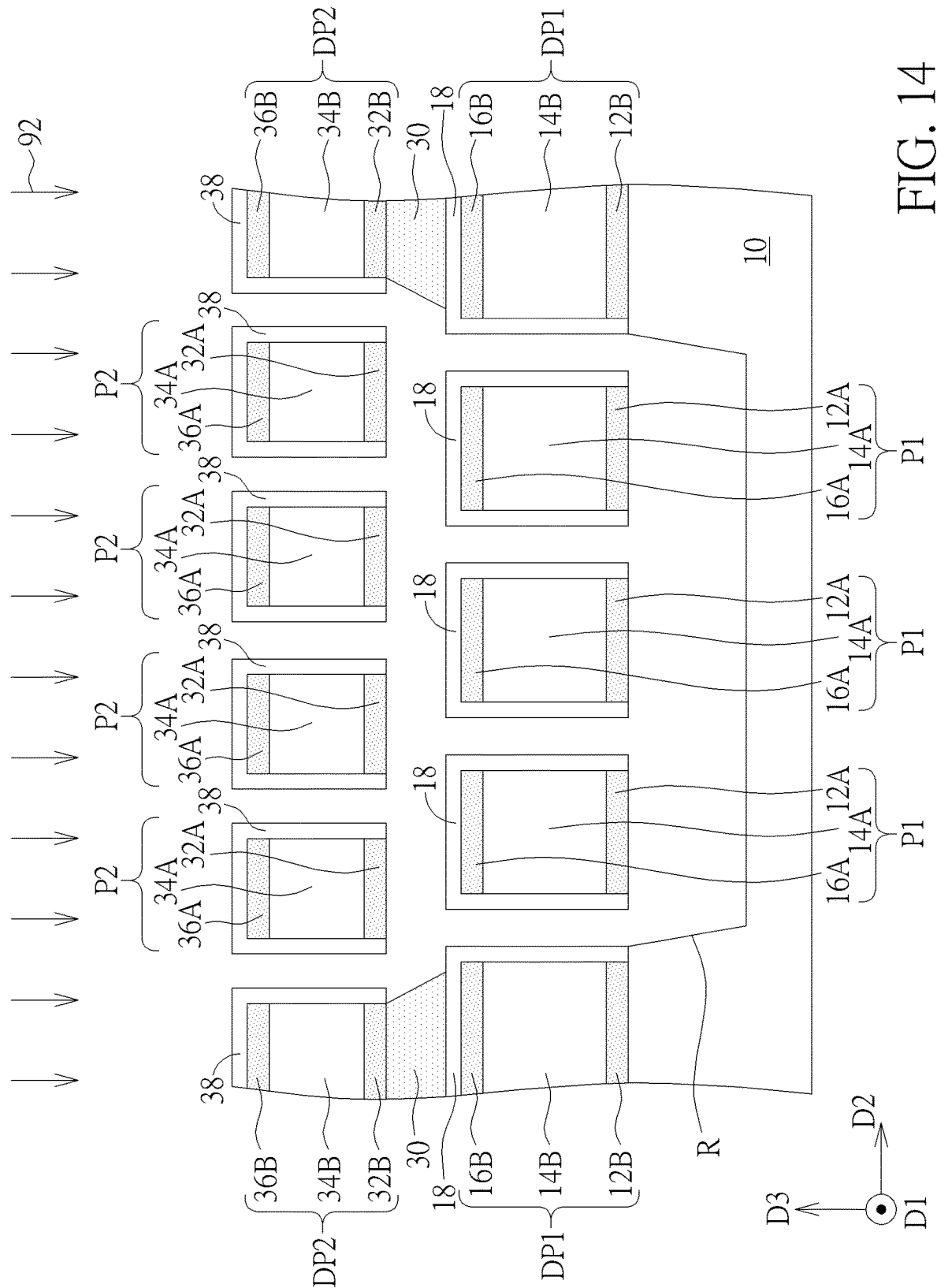
Figure 15:
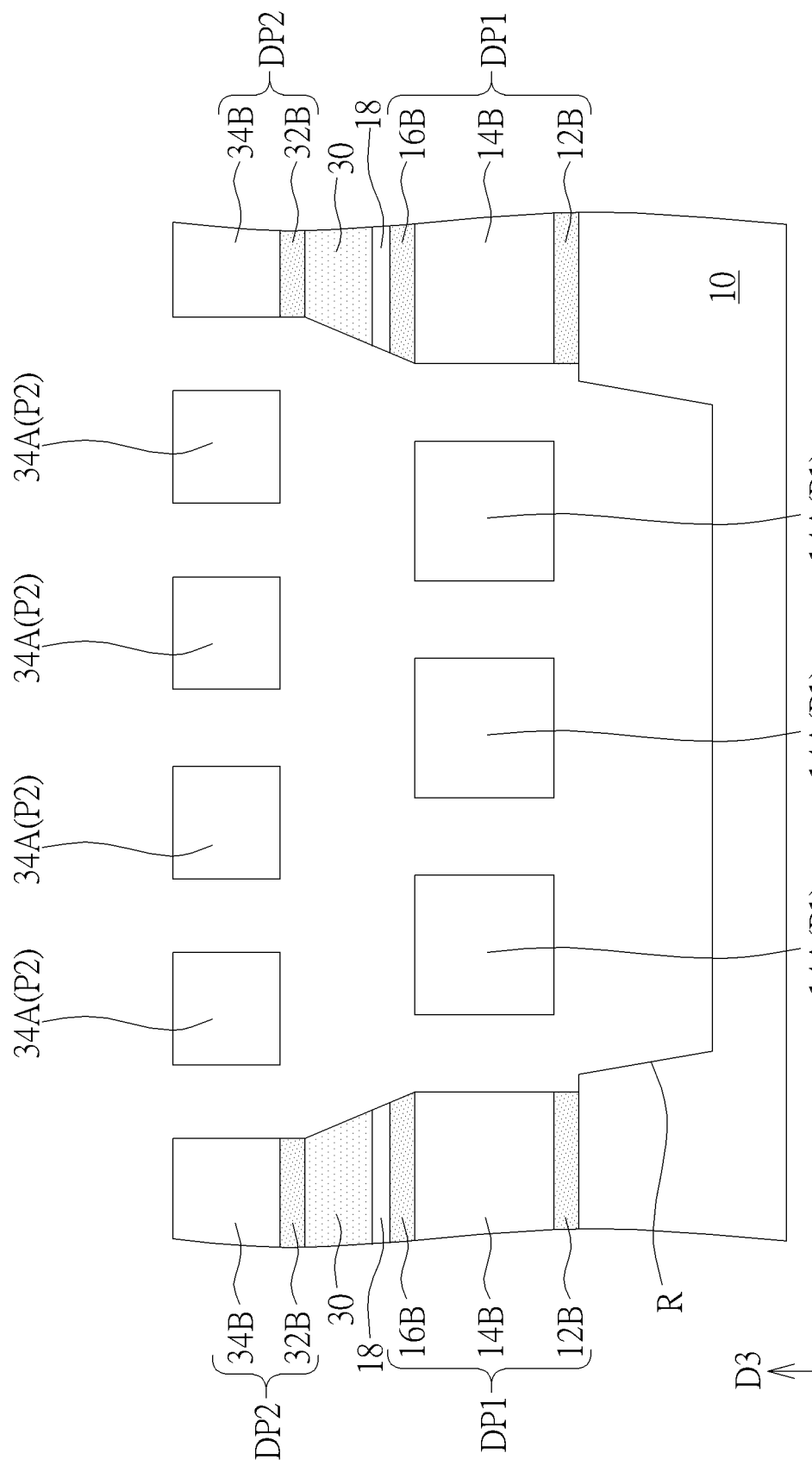
Figure 16:
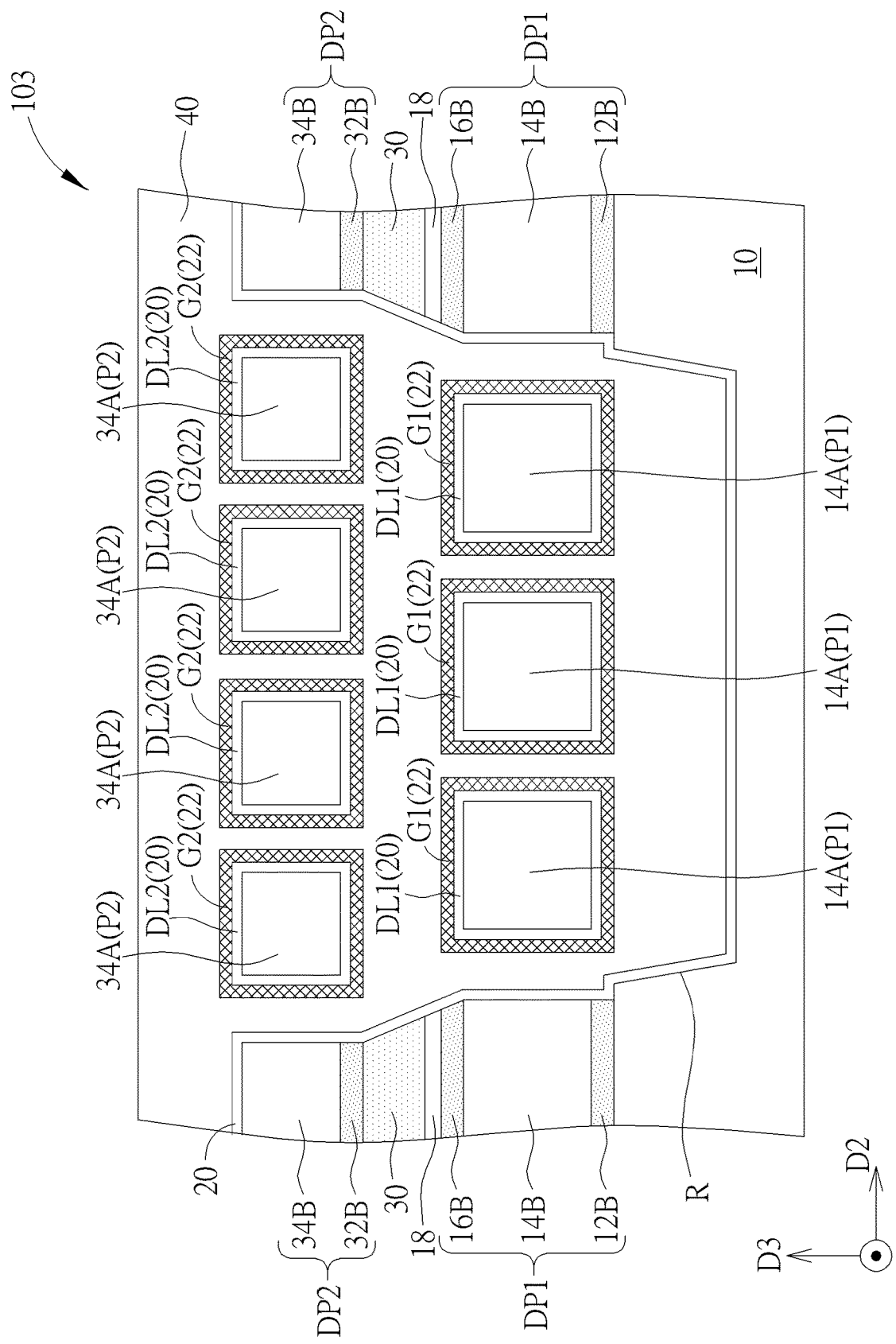

Please refer to FIG. 6 and FIGS. 12-16. FIGS. 12-16 are schematic drawings illustrating a manufacturing method of a semiconductor device according to a third embodiment of the present invention, wherein FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, and FIG. 12 may be regarded as a schematic drawing in a step subsequent to FIG. 6. As shown in FIG. 6 and FIG. 12, in the manufacturing method of this embodiment, a filling layer 30 may be formed covering the first patterned structures P1 after the first etching process 91. In some embodiments, the filling layer 30 may further cover the first dummy patterned structures DP and the space between the first patterned structures P1 adjacent to each other, the space between the first patterned structure P1 and the first dummy patterned structure DP1, and the recess R may be filled with the filling layer 30, but not limited thereto. The filling layer 30 may include polysilicon or other suitable material having relatively better gap-filling ability and relatively better etching selectivity in relation to the first protection layer 18 and the first bottom protection patterns 12A. In other words, the material composition of the filling layer 30 may be different from the material composition of the first protection layer 18 and the material composition of the first bottom protection pattern 12A, and the etching property of the material of the filling layer 30 may be similar to that of the material of the substrate 10, but not limited thereto.

Subsequently, as shown in FIG. 12 and FIG. 13, a plurality of second patterned structures P2 may be formed on the filling layer 30. Each of the second patterned structures P2 may include a second semiconductor pattern 34A and a second bottom protection pattern 32A, and the second bottom protection pattern 32A may be disposed between the second semiconductor pattern 34A and the filling layer 30. In some embodiments, the second bottom protection pattern 32A may include an insulation material, such as silicon oxide, silicon nitride, silicon oxynitride, or other suitable protection materials, and the second semiconductor pattern 34A may include silicon, germanium, silicon-germanium, or other suitable semiconductor materials. In addition, the forming method of the second patterned structures P2 in this embodiment may include but is not limited to the following steps. Firstly, as shown in FIG. 12, a second bottom protection layer 32, a second semiconductor layer 34, and a second top protection layer 36 may be formed sequentially and stacked on the filling layer 30. As shown in FIG. 12 and FIG. 13, a patterning process may be performed to the second bottom protection layer 32, the second semiconductor layer 34, and the second top protection layer 36 for forming the second patterned structures P2. In other words, the forming method of the second patterned structures P2 may be similar to that of the first patterned structures P1, but not limited thereto. In some embodiments, the second bottom protection layer 32 and the second top protection layer 36 may include an insulation material, such as silicon oxide, silicon nitride, silicon oxynitride, or other suitable protection materials, and the second semiconductor layer 34 may include silicon, germanium, silicon-germanium, or other suitable semiconductor materials. Additionally, the forming methods of the second bottom protection layer 32 and the second top protection layer 36 may be similar to those of the first bottom protection layer 12 and the first top protection layer 16 described above, and the forming method of the second semiconductor layer 34 may be similar to that of the first semiconductor layer 14 described above, but not limited thereto.

In some embodiments, the second bottom protection layer 32, the second semiconductor layer 34, and the second top protection layer 36 may be etched by one or more etching steps for forming the second patterned structures P2, and a projection area of the second bottom protection pattern 32A of each of the second patterned structures P2 in the third direction D3 may be substantially equal to a projection area of the second semiconductor pattern 34A of each of the second patterned structures P2 in the third direction D3, but not limited thereto. Additionally, the second top protection layer 36 may be patterned to be a plurality of second top protection patterns 36A on the second semiconductor patterns 34A respectively by the patterning process described above. In other words, each of the second patterned structures P2 may further include the second top protection pattern 36A disposed on the second semiconductor pattern 34A, but not limited thereto. In some embodiments, each of the second patterned structure P2 may be elongated in the first direction D1 also, the second patterned structures P2 may be disposed parallel to one another, and the second patterned structure P2 may be repeatedly disposed in the second direction D2, but not limited thereto. It is worth noting that, in some embodiments, one of the second semiconductor patterns 34A may partially overlap at least one of the first semiconductor patterns 14A in the thickness direction of the substrate 10 (such as the third direction D3), and the second semiconductor pattern 34A and the first semiconductor pattern 14A partially overlapped by the second semiconductor pattern 34A may be arranged misaligned with one another in the thickness direction of the substrate 10. In other words, the center point of each of the second semiconductor patterns 34A and the center point of the first semiconductor pattern 14A partially overlapped by this second semiconductor pattern 34A may not be aligned with each other in the third direction D3, and each of the second semiconductor patterns 34A may overlap the space between the adjacent first patterned structures P1 in the third direction D3 or overlap the space between the first patterned structure P1 and the first dummy patterned structure DP1 in the third direction D3, but not limited thereto. By disposing the first semiconductor patterns 14A and the second semiconductor patterns 34A located misaligned with one another, the influence of the second semiconductor patterns 34A on the process of forming contact structures (such as gate contact structures) on the first semiconductor patterns 14A may be improved, and that will be beneficial to improve the related structural design limitation accordingly.

Additionally, in the patterning process of forming the second patterned structures P2, some of the second bottom protection layer 32, the second semiconductor layer 34, and the second top protection layer 36 may be patterned to be second dummy patterned structures DP2 disposed at two opposite sides of the second patterned structures P2 in the second direction D2, and the second dummy patterned structures DP2 may overlap at least a part of the first dummy patterned structures DP1 in the third direction D3, but not limited thereto. The second dummy patterned structure DP2 may include a second dummy bottom protection pattern 32B formed by patterning the second bottom protection layer 32, a second dummy semiconductor pattern 34B formed by patterning the second semiconductor layer 34, and a second dummy top protection pattern 36B formed by patterning the second top protection layer 36. Additionally, in some embodiments, a planarization process may be performed to the filling layer 30 before the step of forming the second bottom protection layer 32 for avoiding the influence on the formation of the second patterned structures P2, but not limited thereto.

As shown in FIG. 13, a second protection layer 38 may be formed on the second patterned structures P2 and the filling layer 30 after the step of forming the second patterned structures P2, and a part of the second protection layer 38 may be located between the second patterned structures P2. Subsequently, a second opening OP2 may be formed in the second protection layer 38 between the second patterned structures P2, and the second opening OP2 may penetrate the second protection layer 38 and expose a part of the filling layer 30. In some embodiments, a plurality of the second openings OP2 may be formed in the second protection layer 38. Some of the second openings OP2 may be formed in the second protection layer 38 between the second patterned structures P2, and some of the second openings OP2 may be formed in the second protection layer 38 between the second patterned structure P2 and the second dummy patterned structure DP2. The manufacturing method of the second openings OP2 may be similar to that of the first openings OP1 described above, but not limited thereto. Therefore, after the step of forming the second openings OP2, a top surface and a side surface of each of the second patterned structures P2 may still be covered by the second protection layer 38, but not limited thereto. In some embodiments, the second protection layer 38 located on the top surface of the second patterned structure P2 may be partially removed after the step of forming the second openings OP2, but a top surface and a bottom surface of the second semiconductor pattern 34A in each of the second patterned structures P2 may still be covered by the second top protection pattern 36A and the second bottom protection pattern 32A respectively, and a side surface of the second semiconductor pattern 34A may still be covered by the second protection layer 38 for providing a protection effect in subsequent etching processes. Additionally, in some embodiments, a part of the filling layer 30 may be removed by the etching process of forming the second openings OP2, but not limited thereto.

In some embodiments, the second protection layer 38 may be conformally formed on the second patterned structures P2, the second dummy patterned structures DP2 and the filling layer 30. Accordingly, the space between the second patterned structures P2 adjacent to each other and the space between the second patterned structure P2 and the second dummy patterned structure DP2 may not be fully filled with the second protection layer 38 for being beneficial to the formation of the second openings OP2 and reducing the etching time of the etching process for forming the second openings OP2. In some embodiments, the first openings OP2 and the first openings OP1 may be disposed misaligned with one another in the third direction D3, and that will be beneficial to remove the filling layer 30 between the second patterned structure P2 and the first patterned structure P1 in the subsequent process, but not limited thereto.

As shown in FIG. 13 and FIG. 14, a second etching process 92 may be performed after the step of forming the second openings OP2. A part of the filling layer 30 between the substrate 10 and the second patterned structures P2 may be removed by the second etching process 92 for suspending at least a part of each of the second patterned structures P2 above the first patterned structures P1. In some embodiments, the second etching process 92 may include an isotropic etching process, such as a wet isotropic etching process for enhancing the etching selectivity of the second etching process 92 between the filling layer 30 and other material layers (such as the first protection layer 18, the first bottom protection patterns 12A, the second protection layer 38, and the second bottom protection patterns 32A), but not limited thereto. In some embodiments, the second etching process 92 may include other suitable etching approaches according to some considerations, in order to remove the filling layer 30 between the second patterned structure P2 and the first patterned structure P1 and remove the filling layer 30 between the substrate 10 and the first patterned structures P1 with avoiding or reducing etching other material layers, such as the first protection layer 18, the first bottom protection patterns 12A, the second protection layer 38, and the second bottom protection patterns 32A. Additionally, in some embodiments, each of the second semiconductor patterns 34A may be encompassed by the second bottom protection pattern 32A, the second bottom protection pattern 36A, and the second protection layer 38 in the second etching process 92, and each of the first semiconductor patterns 14A may be encompassed by the first bottom protection pattern 12A, the first bottom protection pattern 16A, and the first protection layer 18 in the second etching process 92 for avoiding negative influence of the second etching process 92 on the first semiconductor patterns 14A and the second semiconductor patterns 34A. Additionally, in some embodiments, each of the second semiconductor patterns 34A may be encompassed by the second bottom protection pattern 32A and the second protection layer 38 in the second etching process 92 for providing the protection effect without forming the second top protection patterns 36A according to some considerations. In other words, each of the second semiconductor patterns 34A and each of the first semiconductor patterns 14A are not exposed in the second etching process 93 for avoiding negative influence of the second etching process 92 on the first semiconductor patterns 14A and the second semiconductor patterns 34A.

As shown in FIG. 14 and FIG. 15, after the second etching process 92, at least a part of each of the second top protection patterns 36A, at least a part of each of the second bottom protection patterns 32A, at least a part of the second protection layer 38, at least a part of each of the first top protection patterns 16A, at least a part of each of the first bottom protection patterns 12A, and at least a part of the first protection layer 18 may be removed for exposing at least a part of each of the second semiconductor patterns 34A and at least a part of each of the first semiconductor patterns 14A. In some embodiments, after the above-mentioned step of removing at least a part of each of the second top protection patterns 36A, at least a part of each of the second bottom protection patterns 32A, at least a part of the second protection layer 38, at least a part of each of the first top protection patterns 16A, at least a part of each of the first bottom protection patterns 12A, and at least a part of the first protection layer 18, a part of the second dummy bottom protection pattern 32B, a part of the filling layer 30, a part of the first protection layer 18, and a part of the first dummy top protection pattern 16B may still remain between the second dummy semiconductor pattern 34B and the first dummy semiconductor pattern 14B in the third direction D3, but not limited thereto.

Subsequently, as shown in FIG. 15 and FIG. 16, a gate dielectric layer 20 may be formed on the exposed part of each of the second semiconductor patterns 34A and the exposed part of each of the first semiconductor patterns 14A, and a gate structure 22 may be formed on the gate dielectric layer 20. A part of each of the second semiconductor patterns 34A and a part of each of the first semiconductor patterns 14A may be encompassed by the gate dielectric layer 20 and the gate structure 22. In some embodiments, parts of the gate structure 22 formed on the second semiconductor patterns 34A respectively may be separated from one another, parts of the gate structure 22 formed on the first semiconductor patterns 14A respectively may be separated from one another, and the gate structure 22 formed on the second semiconductor pattern 34A may be separated from the gate structure 22 formed on the first semiconductor pattern 14A for forming a plurality of the GAA transistor structures stacked in the third direction D3 and separated from one another, but not limited thereto. In some embodiments, the gate structure 22 formed on the second semiconductor patterns 34A may be connected with the gate structure 22 formed on the first semiconductor patterns 14A (similar to the condition shown in FIG. 11 described above) according to some considerations, but not limited thereto. It is worth noting that, by the manufacturing method in this embodiment, the material composition of the first semiconductor pattern 14A may be different from the material composition of the second semiconductor pattern 34A because the first semiconductor pattern 14A and the second semiconductor pattern 34A stacked in the third direction D3 may be formed by different processes respectively, and GAA transistor structures with different electrical performances may be formed accordingly, but not limited thereto. Additionally, as shown in FIG. 16, in some embodiments, a dielectric layer 40 may be formed covering the gate structures 22, formed between the gate structures 22, and formed in the recess R after the step of forming the gate structures 22, but not limited thereto. The dielectric layer 40 may include silicon oxide, silicon nitride, silicon oxynitride, or other suitable insulation materials.

As shown in FIG. 16, the semiconductor device 103 may include the substrate 10 including the recess R, a plurality of the first semiconductor patterns 14A, and a plurality of the second semiconductor patterns 34A. The first semiconductor patterns 14A are disposed on the substrate 10, and at least a part of each of the first semiconductor patterns 14A is disposed above the recess R in the third direction D3. The second semiconductor patterns 34A are disposed above the first semiconductor patterns 14A, and the second semiconductor patterns 34A and the first semiconductor patterns 14A are arranged misaligned with one another in the thickness direction of the substrate 10 (such as the third direction D3). In addition, each of the second semiconductor patterns 34A may partially overlap at least one of the first semiconductor patterns 14A in the third direction D3, and each of the second semiconductor patterns 34A and the first semiconductor pattern 14A partially overlapped by the second semiconductor pattern 34A are arranged misaligned with one another in the third direction D3. In some embodiments, each of the first semiconductor patterns 14A and each of the second semiconductor patterns 34A may be elongated in the first direction D1 respectively, and an elongation direction of each of the first semiconductor patterns 14A may be parallel to an elongation direction of each of the second semiconductor patterns 34A accordingly, but not limited thereto. In addition, the gate structure 22 formed on each of the first semiconductor patterns 14A may be regarded as a first gate structure G1, the gate dielectric layer 20 formed on each of the first semiconductor patterns 14A may be regarded as a first gate dielectric layer DL1, the gate structure 22 formed on each of the second semiconductor patterns 34A may be regarded as a second gate structure G2, and the gate dielectric layer 20 formed on each of the second semiconductor patterns 34A may be regarded as a second gate dielectric layer DL2. Therefore, the semiconductor device 103 may include a plurality of the first gate structures G1, a plurality of the first gate dielectric layers DL1, a plurality of the second gate structures G2, and a plurality of the second gate dielectric layers DL2. Each of the first gate structures G1 and the corresponding first gate dielectric layer DL1 may encompass a part of one of the first semiconductor patterns 14A, and each of the second gate structures G2 and the corresponding second gate dielectric layer DL2 may encompass a part of one of the second semiconductor patterns 34A. The first gate structures G1 may be separated from one another, the second gate structures G2 may be separated from one another, the first gate structures G1 may be separated from the second gate structures G2, and the first gate structures G1 may be separated from the substrate 10. In other words, the semiconductor device 103 may include a plurality of GAA transistor structures stacked in the third direction D3, separated from one another, and disposed misaligned with one another in the third direction D3, but not limited thereto. In addition, the semiconductor device 103 may include the dielectric layer 40 covering the first gate structures G1 and the second gate structures G2, and the dielectric layer 40 may be partly disposed in the recess R.

By the manufacturing method of this embodiment, transistor structures may be formed stacked by multiple layers (two or more layers) and separated from one another for enhancing the device integrity and/or the electrical performance of the semiconductor device. In addition, by disposing the first semiconductor pattern 14A and the second semiconductor pattern 34A misaligned with each other in the third direction D3, the first gate structure G1 formed on the first semiconductor pattern 14A and the second gate structure G2 formed on the second semiconductor pattern 34A may be disposed misaligned with each other in the third direction D3 also. The influence of the second gate structures G2 on the process of forming contact structures (such as gate contact structures formed in the dielectric layer 40) on the first gate structures G1 may be improved, and that will be beneficial to improve the related structural design limitation and/or improve the related manufacturing yield accordingly.

Figure 17:
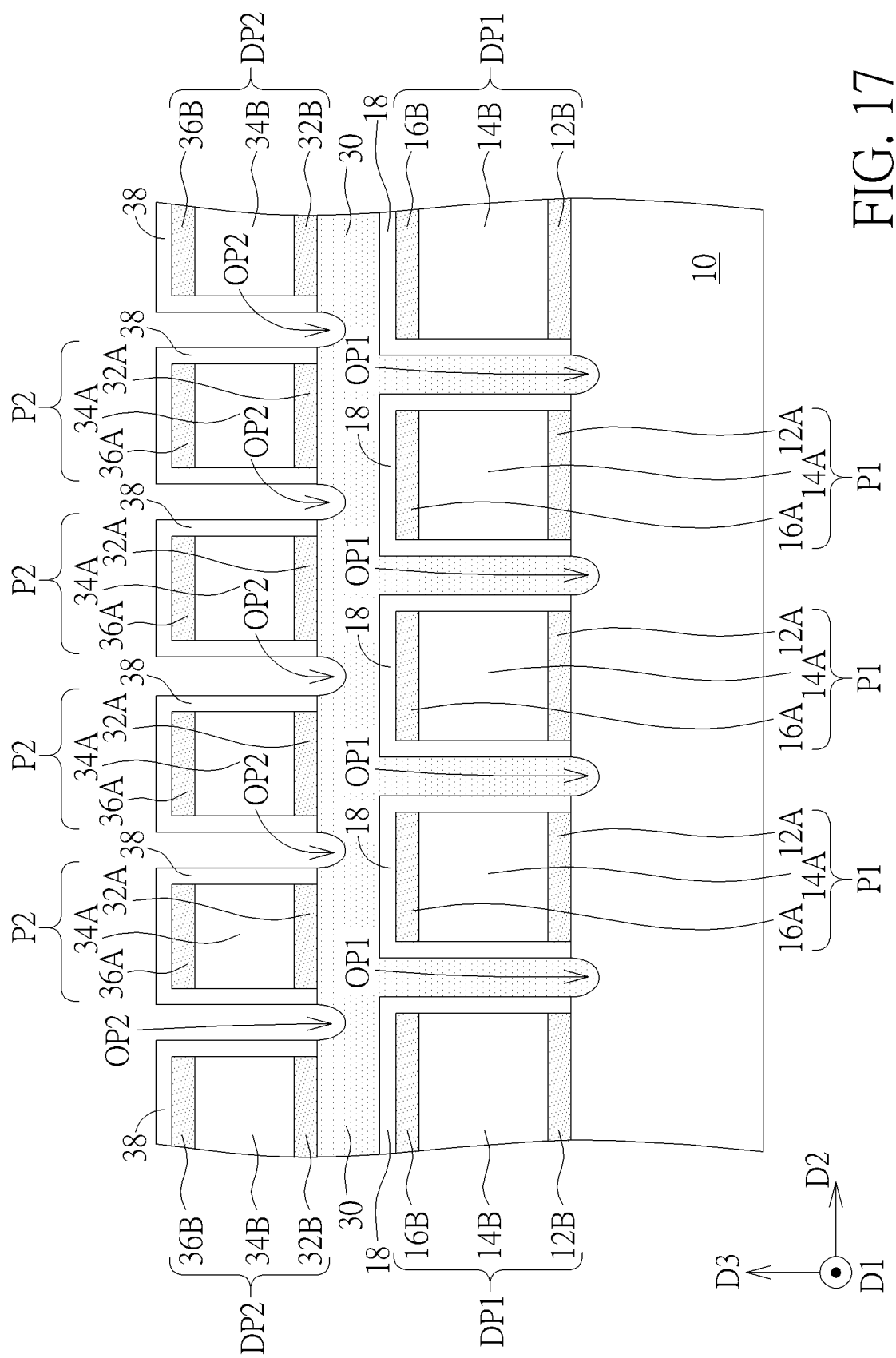
Figure 18:
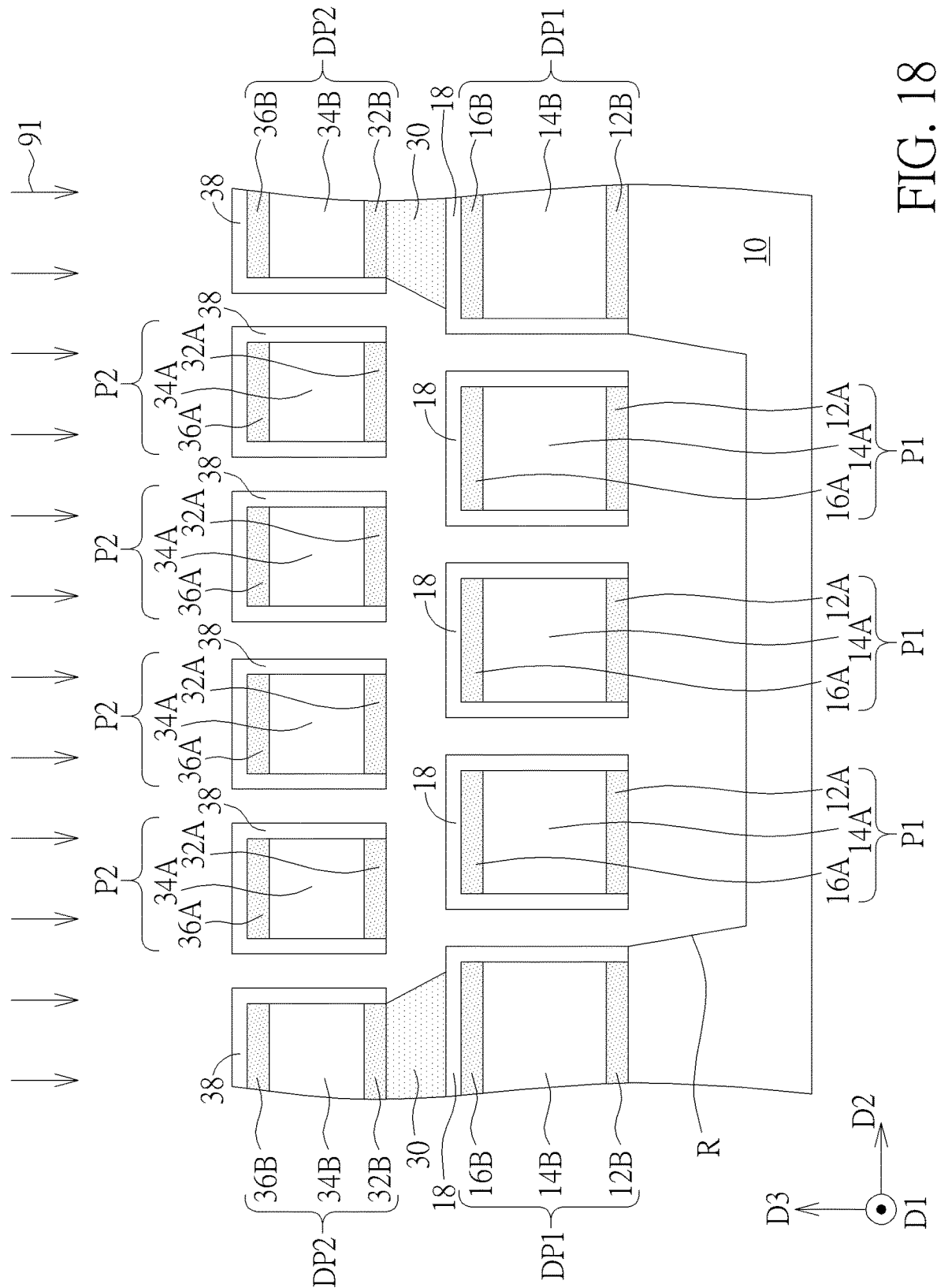

Please refer to FIG. 4, FIG. 17, and FIG. 18. FIG. 17 and FIG. 18 are schematic drawings illustrating a manufacturing method of a semiconductor device according to a fourth embodiment of the present invention, wherein FIG. 18 is a schematic drawing in a step subsequent to FIG. 17, and FIG. 17 may be regarded as a schematic drawing in a step subsequent to FIG. 4. As shown in FIG. 4, FIG. 17, and FIG. 18, in the manufacturing method of this embodiment, the filling layer 30 may be formed covering the first patterned structures P1 after the step of forming the first openings OP1 and before the step of forming the recess R, and the second patterned structures P2, the second dummy patterned structures DP2, and the second protection layer 38 may be formed on the filling layer 30 subsequently. After the step of forming the second openings OP2 in the second protection layer 38, the firs etching process 91 may be performed for removing a part of the filling layer 30 between the substrate 10 and the second patterned structures D2 and suspending at least a part of each of the second patterned structures P2 above the first patterned structures P1. Additionally, a part of the substrate 10 under the first patterned structures P1 may be removed by the first etching process 91 also for suspending at least a part of each of the first patterned structures P1 above the substrate 10. In some embodiments, the first etching process 91 may include a single etching step configured to removing a part of the filling layer 30 and a part of the substrate 10 concurrently, especially when the etching property of the material of the filling layer 30 is similar to that of the material of the substrate 10, but not limited thereto. In some embodiments, the first etching process 91 may include different etching steps for removing the part of the filling layer 30 and the part of the substrate 10 respectively.

Figure 19:
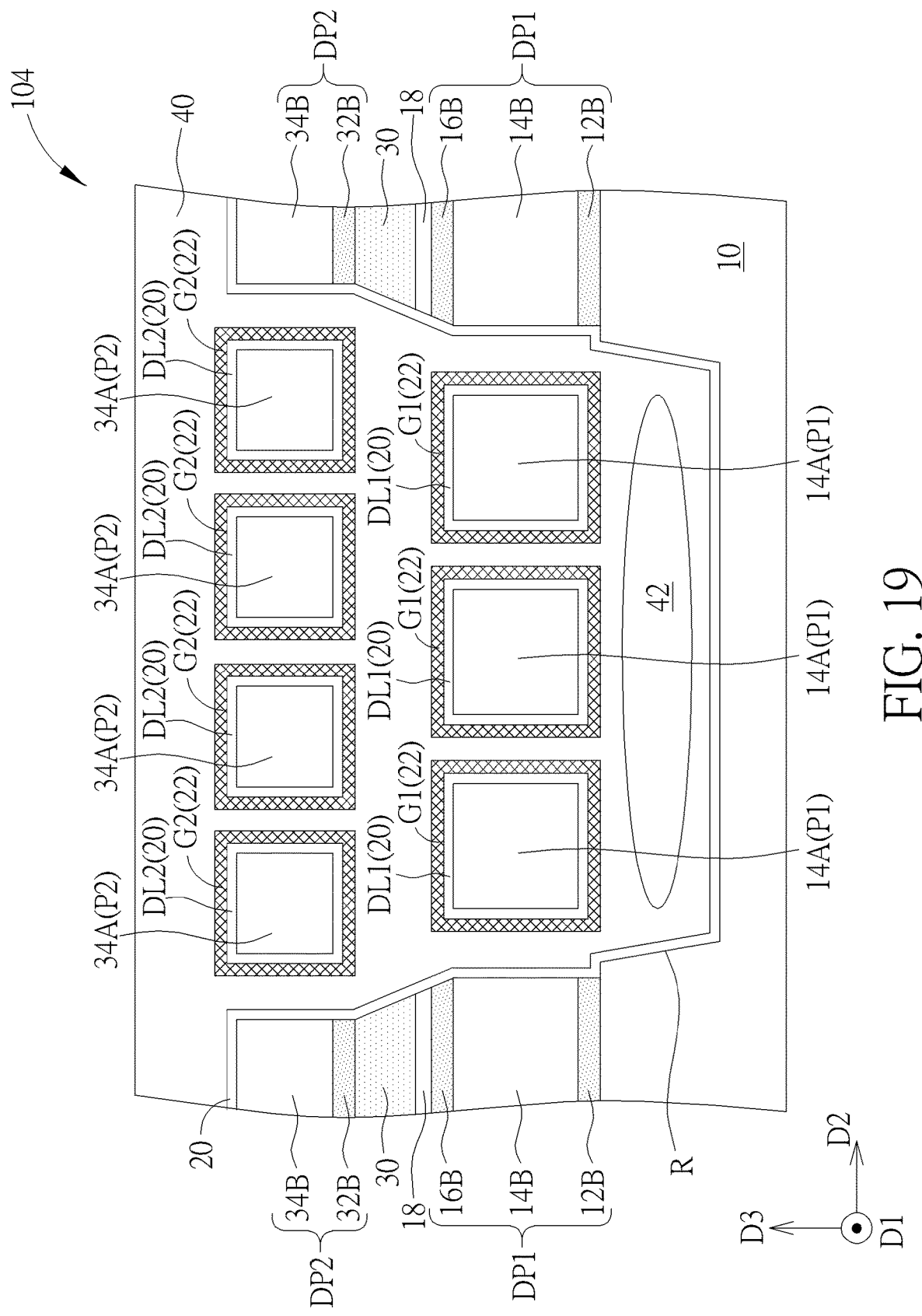
FIG. 19 is a schematic drawing illustrating a semiconductor device according to a fifth embodiment of the present invention.

Please refer to FIG. 19. FIG. 19 is a schematic drawing illustrating a semiconductor device 104 according to a fifth embodiment of the present invention. As shown in FIG. 19, the difference between the semiconductor device 104 and the semiconductor device in the third embodiment described above is that, in the step of forming the dielectric layer 40, the process parameters of forming the dielectric layer 40 and/or the material used to form the dielectric layer 40 may be modified (such as using a material with relatively worse gap-filling ability to form the dielectric layer 40) for forming an air gap 42 in the dielectric layer 40 located in the recess R. The air gap 42 may be used to improve the isolation between the substrate 10 and the first gate structures G1 and/or the isolation between other part formed in the substrate 10 (such as other active components and/or positive components) and the first gate structures G1, and that will be beneficial for the entire electrical performance of the semiconductor device 103. It is worth noting that the dielectric layer 40 and the air gap 42 in this embodiment may also be applied to other embodiments of the present invention (such as the first embodiment described above).

To summarize the above descriptions, according to the semiconductor device and the manufacturing method thereof in the present invention, the bottom protection pattern and the protection layer may be used to form the protection effect for the semiconductor pattern for avoiding the negative influence of the etching process for suspending a part of the semiconductor pattern on the semiconductor pattern. In addition, the semiconductor patterns staked in the thickness direction of the substrate and arranged misaligned with one another in the thickness direction of the substrate may be formed by the manufacturing method of the present invention, and the device integrity may be enhanced and/or the related structural design limitation may be reduced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   forming first patterned structures on a substrate, wherein each of the first patterned structures comprises:
      a first semiconductor pattern; and
      a first bottom protection pattern disposed between the first semiconductor pattern and the substrate;
   forming a first protection layer on the first patterned structures and the substrate, wherein a part of the first protection layer is located between the first patterned structures;
   forming a first opening in the first protection layer between the first patterned structures, wherein the first opening penetrates the first protection layer and exposes a part of the substrate;
   performing a first etching process after the step of forming the first opening, wherein a part of the substrate under the first patterned structures is removed by the first etching process for suspending at least a part of each of the first patterned structures above the substrate;
   removing at least a part of each of the first bottom protection patterns and at least a part of the first protection layer after the first etching process for exposing at least a part of each of the first semiconductor patterns;
   forming a first gate dielectric layer on the exposed part of each of the first semiconductor patterns; and
   forming a first gate structure on the first gate dielectric layer, wherein a part of each of the first semiconductor patterns is encompassed by the first gate dielectric layer and the first gate structure.

2. The manufacturing method of the semiconductor device according to claim 1, wherein each of the first semiconductor patterns is encompassed by the first bottom protection pattern and the first protection layer in the first etching process.

3. The manufacturing method of the semiconductor device according to claim 1, wherein the first gate structure is suspended above the substrate.

4. The manufacturing method of the semiconductor device according to claim 1, wherein the first gate structure formed on one of the first semiconductor patterns is separated from the first gate structure formed on another one of the first semiconductor patterns.

5. The manufacturing method of the semiconductor device according to claim 1, wherein each of the first patterned structures further comprises a first top protection pattern disposed on the first semiconductor pattern, and each of the first semiconductor patterns is encompassed by the first bottom protection pattern, the first top protection pattern, and the first protection layer in the first etching process.

6. The manufacturing method of the semiconductor device according to claim 5, further comprising:
   removing at least a part of each of the first top protection patterns after the first etching process.

7. The manufacturing method of the semiconductor device according to claim 1, further comprising:
   forming a filling layer covering the first patterned structures;
   forming second patterned structures on the filling layer, wherein each of the second patterned structures comprises:
      a second semiconductor pattern; and
      a second bottom protection pattern disposed between the second semiconductor pattern and the filling layer;
   forming a second protection layer on the second patterned structures and the filling layer, wherein a part of the second protection layer is located between the second patterned structures; and
   forming a second opening in the second protection layer between the second patterned structures, wherein the second opening penetrates the second protection layer and exposes a part of the filling layer.

8. The manufacturing method of the semiconductor device according to claim 7, further comprising:
   performing a second etching process after the step of forming the second opening, wherein a part of the filling layer between the substrate and the second patterned structures is removed by the second etching process for suspending at least a part of each of the second patterned structures above the first patterned structures.

9. The manufacturing method of the semiconductor device according to claim 8, further comprising:
   removing at least a part of each of the second bottom protection patterns and at least a part of the second protection layer after the second etching process for exposing at least a part of each of the second semiconductor patterns;
   forming a second gate dielectric layer on the exposed part of each of the second semiconductor patterns; and
   forming a second gate structure on the second gate dielectric layer, wherein a part of each of the second semiconductor patterns is encompassed by the second gate dielectric layer and the second gate structure.

10. The manufacturing method of the semiconductor device according to claim 7, wherein the first etching process is performed after the step of forming the second opening, and a part of the filling layer between the substrate and the second patterned structures is removed by the first etching process for suspending at least a part of each of the second patterned structures above the first patterned structures.

11. The manufacturing method of the semiconductor device according to claim 7, wherein one of the second semiconductor patterns partially overlaps at least one of the first semiconductor patterns in a thickness direction of the substrate, and the second semiconductor pattern and the first semiconductor pattern partially overlapped by the second semiconductor pattern are arranged misaligned with one another in the thickness direction of the substrate.

* * * * *